(12) United States Patent
Freeman et al.

(10) Patent No.: US 8,999,844 B2
(45) Date of Patent: Apr. 7, 2015

(54) APPARATUSES INCLUDING STAIR-STEP STRUCTURES AND METHODS OF FORMING THE SAME

(71) Applicant: Micron Technology, Inc., Boise, ID (US)

(72) Inventors: Eric H. Freeman, Kuna, ID (US); Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/015,696

(22) Filed: Aug. 30, 2013

(65) Prior Publication Data
US 2013/0341798 A1 Dec. 26, 2013

Related U.S. Application Data

(63) Continuation of application No. 13/151,892, filed on Jun. 2, 2011, now Pat. No. 8,530,350.

(51) Int. Cl.
H01L 21/44 (2006.01)
H01L 21/461 (2006.01)
(Continued)

(52) U.S. Cl.
CPC .... *H01L 21/76892* (2013.01); *H01L 27/11548* (2013.01); *H01L 27/11556* (2013.01);
(Continued)

(58) Field of Classification Search
CPC ............... H01L 21/76892; H01L 27/11548; H01L 27/11556
USPC ................ 438/666, 739; 257/319, E21.214, 257/E21.614
See application file for complete search history.

(56) References Cited

U.S. PATENT DOCUMENTS 5,707,885 A 1/1998 Lim et al.
7,618,894 B2 11/2009 Bornstein et al.
(Continued)

FOREIGN PATENT DOCUMENTS

EP 2 136 398 A1 12/2009
JP 2008258458 A 10/2008
(Continued)

OTHER PUBLICATIONS

Endoh, et al., "Novel Ultrahigh Density Flash Memory with a Stacked Surrounding Gate Transistor (S-SGT) Structured Cell," IEEE Transactions on Electron Devices, vol. 50, No. 4, pp. 945-951 (Apr. 2003).
(Continued)

*Primary Examiner* — Luan C Thai
(74) *Attorney, Agent, or Firm* — TraskBritt

(57) ABSTRACT

Methods for forming semiconductor structures are disclosed, including a method that involves forming sets of conductive material and insulating material, forming a first mask over the sets, forming a first number of contact regions, forming a second mask over a first region of the sets, and removing material from of the sets in a second, exposed region laterally adjacent the first region to form a second number of contact regions. Another method includes forming first and second contact regions on portions of sets of conductive materials and insulating materials, each of the second contact regions more proximal to an underlying substrate than each of the first contact regions. Apparatuses such as memory devices including laterally adjacent first and second regions each of which including contact regions of a different portion of a plurality of conductive materials and related methods of forming such devices are also disclosed.

17 Claims, 25 Drawing Sheets

(51) Int. Cl.
  *H01L 29/76* (2006.01)
  *H01L 21/302* (2006.01)
  *H01L 21/822* (2006.01)
  *H01L 21/768* (2006.01)
  *H01L 27/115* (2006.01)
  *H01L 23/528* (2006.01)

(52) U.S. Cl.
  CPC .... *H01L27/11575* (2013.01); *H01L 27/11582* (2013.01); *H01L 21/76838* (2013.01); *H01L 23/528* (2013.01)

(56) References Cited

U.S. PATENT DOCUMENTS

| | | | |
|---|---|---|---|
| 8,227,897 B2 | 7/2012 | Kim | |
| 8,569,829 B2 * | 10/2013 | Kiyotoshi | 257/326 |
| 2007/0252201 A1 | 11/2007 | Kito et al. | |
| 2009/0310415 A1 | 12/2009 | Jin et al. | |
| 2009/0310425 A1 | 12/2009 | Sim et al. | |
| 2010/0117143 A1 | 5/2010 | Lee et al. | |
| 2010/0207186 A1 * | 8/2010 | Higashi et al. | 257/314 |
| 2010/0258913 A1 | 10/2010 | Lue | |
| 2010/0323505 A1 | 12/2010 | Ishikawa et al. | |
| 2011/0018036 A1 * | 1/2011 | Hwang et al. | 257/208 |
| 2011/0031630 A1 | 2/2011 | Hashimoto | |
| 2012/0306089 A1 | 12/2012 | Freeman et al. | |
| 2012/0306090 A1 | 12/2012 | Smith et al. | |

FOREIGN PATENT DOCUMENTS

| | | |
|---|---|---|
| JP | 2010192589 A | 9/2010 |
| JP | 2010199311 A | 9/2010 |
| WO | 2010004047 A1 | 1/2010 |

OTHER PUBLICATIONS

Fukuzumi, et al., "Optimal Integration and Characteristics of Vertical Array Devices for Ultra High Density, Bit Cost Scalable Flash Memory," IEDM Technical Digest, pp. 449-452 (2007).
International Search Report for International Application No. PCT/US2012/039215, dated Dec. 26, 2012, 3 pages.
International Written Opinion for International Application No. PCT/US2012/039215, dated Dec. 26, 2012, 5 pages.
Tanaka, et al., "Bit Cost Scalable Technology with Punch and Plug Process for Ultra High Density Flash Memory," Symposium on VLSI Technology Digest of Technical Papers, pp. 14-15 (2007).
Supplementary European Search Report and Search Opinion, Application No. EP 12792601.2, issued by the ISA/EP on Sep. 30, 2014, six (6) pages.
Japanese Office Action for Japanese Application No. 2014-513577 dated Dec. 2, 2014, 4 pages.

* cited by examiner

APPARATUSES INCLUDING STAIR-STEP STRUCTURES AND METHODS OF FORMING THE SAME

CROSS-REFERENCE TO RELATED APPLICATION

This application is a continuation of U.S. patent application Ser. No. 13/151,892, filed Jun. 2, 2011, now U.S. Pat. No. 8,530,350, issued Sep. 10, 2013, the disclosure of which is hereby incorporated herein in its entirety by this reference.

TECHNICAL FIELD

Embodiments of the present disclosure relate to apparatuses such as three-dimensional semiconductor devices and systems including the same. Embodiments of the present disclosure also relate to so-called "stair-step" structures including conductive materials in so-called "stair-step" configurations for electrical connection between, for example, memory cells and conductive lines. Other embodiments of the present disclosure relate to methods for forming stair-step structures and devices including stair-step structures.

BACKGROUND

The semiconductor industry has continually sought ways to produce memory devices with an increased number of memory cells per memory die. In non-volatile memory (e.g., NAND flash memory), one way to increase memory density is by using a vertical memory array, which is also referred to as a three-dimensional (3-D) memory array. One type of vertical memory array includes semiconductor pillars that extend through openings (e.g., holes) in layers of conductive material (also referred to as word line plates or control gate plates), with dielectric materials at each junction of the semiconductor pillars and the conductive materials. Thus, multiple transistors can be formed along each pillar. Vertical memory array structures enable a greater number of transistors to be located in a unit of die area by building the array upwards (e.g., vertically) on a die, as compared to structures with traditional planar (e.g., two-dimensional) arrangements of transistors.

Vertical memory arrays and methods of forming them are described in, for example: U.S. Patent Application Publication No. 2007/0252201 of Kito et al., now U.S. Pat. No. 7,936,004, issued May 3, 2011; Tanaka et al., "Bit Cost Scalable Technology with Punch and Plug Process for Ultra High Density Flash Memory," Symposium on VLSI Technology Digest of Technical Papers, pp. 14-15 (2007); Fukuzumi et al., "Optimal Integration and Characteristics of Vertical Array Devices for Ultra-High Density, Bit-Cost Scalable Flash Memory," IEDM Technical Digest, pp. 449-52 (2007); and Endoh et al., "Novel Ultrahigh-Density Flash Memory with a Stacked-Surrounding Gate Transistor (S-SGT) Structured Cell," IEEE Transactions on Electron Devices, vol. 50, no. 4, pp. 945-951 (April, 2003).

Conventional vertical memory arrays require an electrical connection between the conductive materials (e.g., word line plates or control gates) and access lines (e.g., word lines) so that memory cells in the 3-D array may be uniquely selected for writing or reading functions. One method of forming an electrical connection includes forming a so-called "stair-step" structure at the edge of the conductive materials. FIGS. 1A through 1D show one conventional method of creating a stair-step structure 10 in a stack of conductive materials 12. As shown in FIG. 1A, conductive materials 12 are separated by insulating materials 14 between the conductive materials 12. A mask 16 (e.g., photoresist material) is formed over the topmost insulating material 14 and patterned to expose a portion of the insulating material 14a, the exposed portion having a width of one so-called "step" of the stair-step structure 10 to be formed. An anisotropic etch 18, such as a reactive ion etch (RIE) or other dry etch, is performed to remove the insulating material 14a at the portion exposed through the mask 16. The pattern in the insulating material 14a is then transferred to the conductive material 12a. The exposed insulating material 14a is removed by one dry etch process that stops on the conductive material 12a, and the exposed conductive material 12a is then removed by another dry etch process that stops on the insulating material 14b. Next, the mask 16 is reduced in size by removing a portion of the mask (also known as "trimming"), such as by isotropic etching, to expose another portion of the insulating material 14a, as shown in FIG. 1B.

The process is repeated by subjecting the structure to an anisotropic etch 18, including removing exposed portions of the two insulating materials 14a and 14b and subsequently removing exposed portions of the two conductive materials 12a and 12b. As shown in FIG. 1C, the successive reduction in size of the mask 16 and the repeated dry etch processes are continued until the insulating material 14c and conductive material 12c is exposed, the mask 16 is removed, and a stair-step structure 10 remains. Word line contacts 20 are formed to extend through each respective insulating material 14 and electrically contact each conductive material 12, as shown in FIG. 1D. The top of each word line contact 20, as viewed in FIG. 1D, connects to a conductive word line (not shown). While FIGS. 1A through 1D illustrate using two anisotropic etches 18 to create three so-called "steps" of the stair-step structure 10, the acts of etching the insulating material 14, etching the conductive material 12, and trimming the mask 16 may be repeated to create more steps (and thus contact regions for word line contacts). Current conventional methods have been used to form more than eight contact regions (e.g., steps).

As the desired number of steps in the conventional stair-step structure increases, the margin of error associated with each act in the process of forming the steps correspondingly decreases when using the conventional method. For example, and as explained above, each iteration of the conventional method includes trimming the mask, etching the insulating material, and etching the conductive material. The desired number of steps is formed by repeating these acts as many times as the number of conductive materials in the stack. Each act of the conventional method has an associated etch control error because the size of each step is designed to fall within a particular range (e.g., tolerance) to allow enough room for a contact to be formed thereon while keeping the overall size of the stair-step structure small. Additionally, the relative locations of the steps are designed to fall within a range of locations in order to accurately form contacts thereon. As the number of iterations increases, any deviation from a target step width or location may be compounded because errors in one material are transferred to an underlying material. For a high number of steps in the stair-step structure, the margin of error to be achieved for the etch rate control may be less than one percent (1%). Small margins of error are difficult and costly to attain using conventional methods. Furthermore, because the mask is repeatedly trimmed, the method may start with a mask of high thickness, which may be difficult to repeatedly pattern and trim with the precision needed to have the necessary control over step width. Furthermore, the large amount of mask material is expensive and time-consuming to both form and remove.

Space savings in a memory device incorporating a vertical memory array may be accomplished by reducing the area that a stair-step structure covers. One method of reducing this area is described in U.S. Patent Application Publication No. 2009/0310415 to Jin et al., now U.S. Pat. No. 8,325,527, issued Dec. 4, 2012. Although some space is saved by aligning the word line contacts in the same direction as the bit lines, further improvements and reductions in cost in the manufacturing of such structures, as well as alternative methods of reducing the area covered by the stair-step structures, are desired. For example, the method described in Jin et al. uses a unique mask for each etch act to form the steps, which adds significant cost because of a high number of photolithographic reticles used to form the masks. Reductions in cost and improvements in controllability of manufacturing stair-step structures are, therefore, desired.

DETAILED DESCRIPTION

Figure 1A:
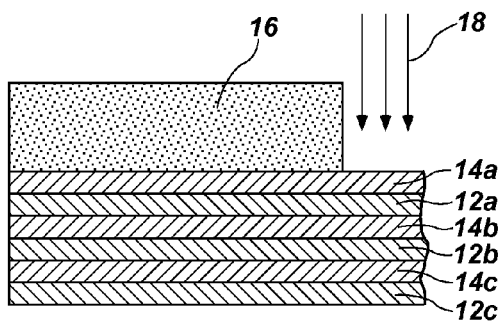
FIGS. 1A through 1D illustrate a conventional method of forming a stair-step structure for a vertical memory array.
Figure 1B:
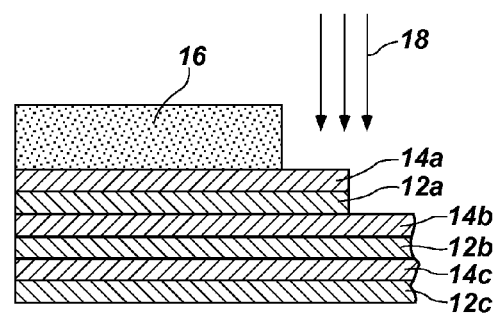
Figure 1C:
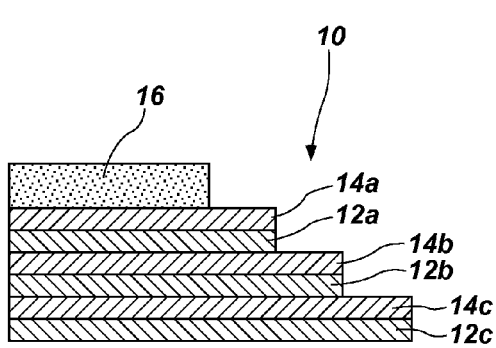
Figure 1D:
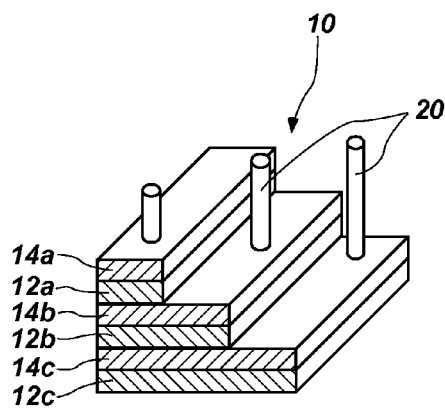

The following description provides specific details, such as material types, material thicknesses, and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional fabrication techniques employed in the industry.

The materials described herein may be formed by any suitable technique including, but not limited to, spin coating, blanket coating, chemical vapor deposition (CVD), ALD, plasma enhanced ALD, or physical vapor deposition (PVD), unless otherwise specified. The materials may also be formed by being grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, and electrical changes may be made without departing from the scope of the disclosure. The illustrations presented herein are not meant to be actual views of any particular system, device, or structure, but are merely idealized representations that are employed to describe the embodiments of the present disclosure. The drawings presented herein are not necessarily drawn to scale.

As used herein, the term "apparatus" includes a device, such as a memory device (e.g., a vertical memory device), or a system that includes such a device.

As used herein, the term "substantially" includes to a degree that one skilled in the art would understand the given parameter, property, or condition is met with a small degree of variance, such as within acceptable manufacturing tolerances.

As used herein, the term "set" includes a conductive material(s) and an immediately adjacent insulating material(s). Each conductive material can form a word line connection separated from additional conductive materials by the insulating material. Each insulating material may insulate (e.g., electrically insulate, separate, isolate from) the conductive material in its set from the conductive material of an adjacent set. The conductive material of each set may form a conductive connection (e.g., a word line connection) for supplying electrical signals to a semiconductor device. Although this disclosure and the accompanying drawings refer to sets that each include an insulating material formed over (e.g., on a side opposite a substrate) a conductive material, this disclosure is not so limited. A set may include a conductive material formed over (e.g., on a side opposite the substrate) an insulating material. The term "set" is used merely for ease in describing, illustrating, and understanding the methods and structures disclosed.

As used herein, any relational term, such as "first," "second," "over," "under," "on," "underlying," "topmost," "next," etc., is used for clarity and convenience in understanding the disclosure and accompanying drawings and does not connote or depend on any specific preference, orientation, or order, except where the context clearly indicates otherwise.

As used herein, the terms "distal" and "proximal" describe positions of materials or features in relation to a substrate upon which the material or feature is formed. For example, the term "distal" refers to a position relatively more distant from the substrate, and the term "proximal" refers to a position in closer relative proximity to the substrate.

Figure 7:
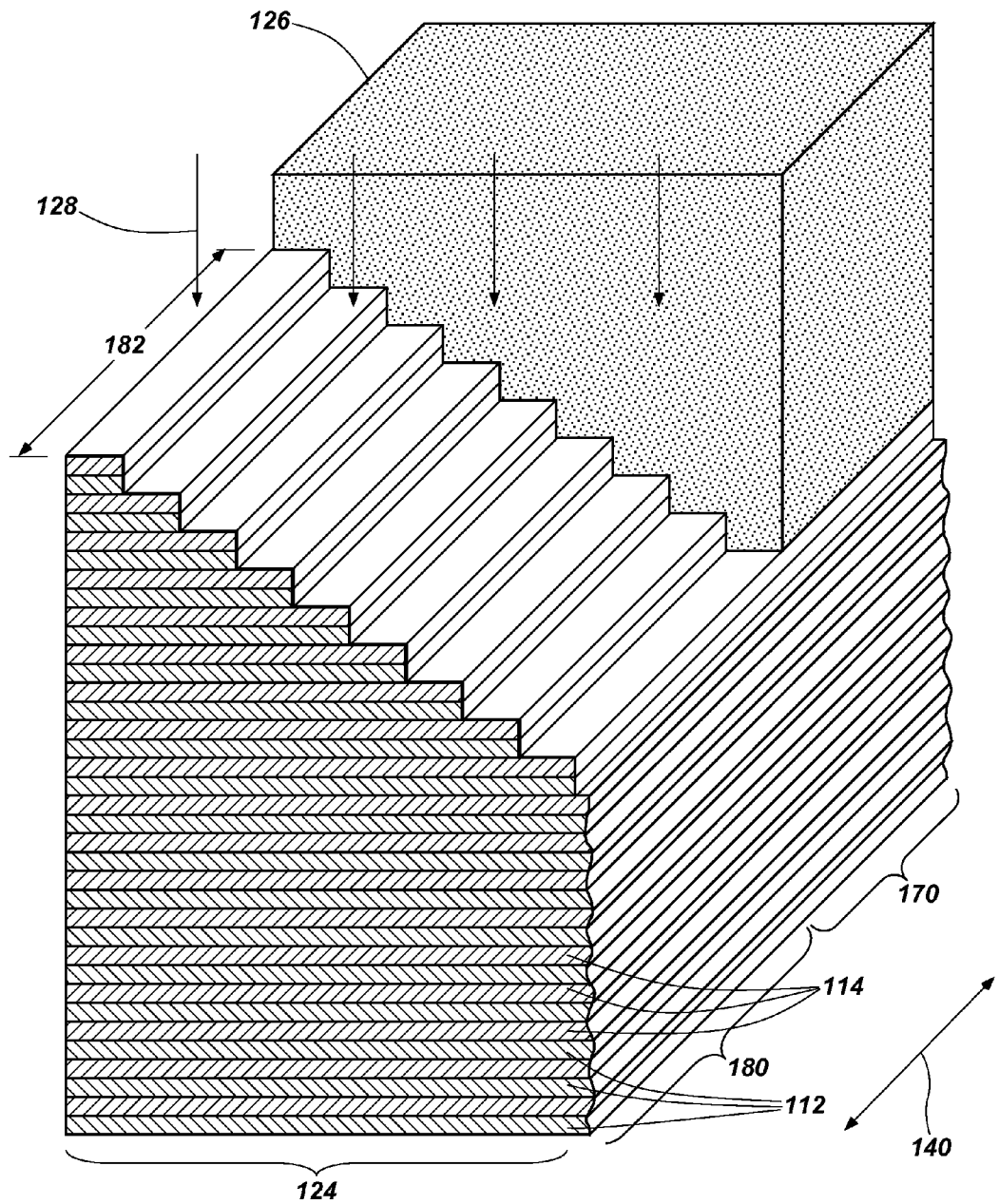

As used herein, the terms "lateral" and "laterally" refer to a direction that is parallel to the direction that a "step" (e.g., contact region) of the stair-step structure extends. For example, the lateral direction may be perpendicular to a direction that access lines (e.g., word lines) extend in a vertical memory device including a stair-step structure to be described in more detail below. The lateral direction may also be parallel to a direction that bit lines extend in a vertical memory device including the stair-step structure. For example, the direction indicated by arrows 140 in FIG. 7 is the lateral direction.

Non-volatile memory devices (e.g., vertical memory devices, such as a three-dimensional NAND memory devices) including a plurality of contact regions on so-called "stair-steps" are disclosed, as are methods of forming such devices. A pattern of the contact regions located along an edge of the non-volatile memory device can be formed on so-called "steps" in the non-volatile memory device. A contact may be formed on each contact region to form connections (e.g., electrical connections) to a conductive material (e.g., word line connection or control gate). While the non-volatile memory devices described herein may make specific reference to NAND devices, the disclosure is not so limited and may be applied to other semiconductor and memory devices. Some embodiments of a stair-step structure of the present disclosure and methods of forming such a stair-step structure are shown in FIGS. 2 through 25 and are described hereafter. Similar structures or components in the various drawings may retain the same or similar numbering for the convenience of the reader; however, the similarity in numbering does not mean that the structures or components are necessarily identical in size, composition, configuration, or any other property. Embodiments disclosed herein include stair-step structures (see FIGS. 9, 10, 12, 14, 20) that include at least two regions laterally adjacent each other, each region of the at least two regions providing access to a portion of a plurality of conductive materials. A first region may provide access to a first portion of the plurality of conductive materials. A second region may provide access to a second portion of the plurality of conductive materials different from the first portion. Embodiments disclosed herein also include methods of forming stair-step structures.

An embodiment of a method of forming a stair-step structure 100 for electrical access to a vertical device (e.g., memory array) is illustrated by way of example in FIGS. 2 through 10. Alternating conductive materials 112 and insulating materials 114 may be formed over a substrate (not shown) by conventional methods. The substrate over which the conductive materials 112 and insulating materials 114 are formed may be any substantially planar material. By way of non-limiting example, the substrate may be a semiconductor material and may include at least portions of circuits to which transistors of a memory array may be connected. Each conductive material 112 may be used to form a conductive connection (e.g., word line connection, control gate), although the disclosure is not so limited. Each conductive material 112 may, by way of non-limiting example, be a substantially planar conductive material 112. As used herein, the term "substrate" includes a semiconductor-based material including silicon, silicon-on-insulator (SOI) or silicon-on-sapphire (SOS) technology, doped and undoped silicon, doped and undoped semiconductors, epitaxial layers of silicon supported by a base semiconductor foundation, and other semiconductor structures. When reference is made to a "substrate" in the following description, previous process acts may have been conducted to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

Figure 2:
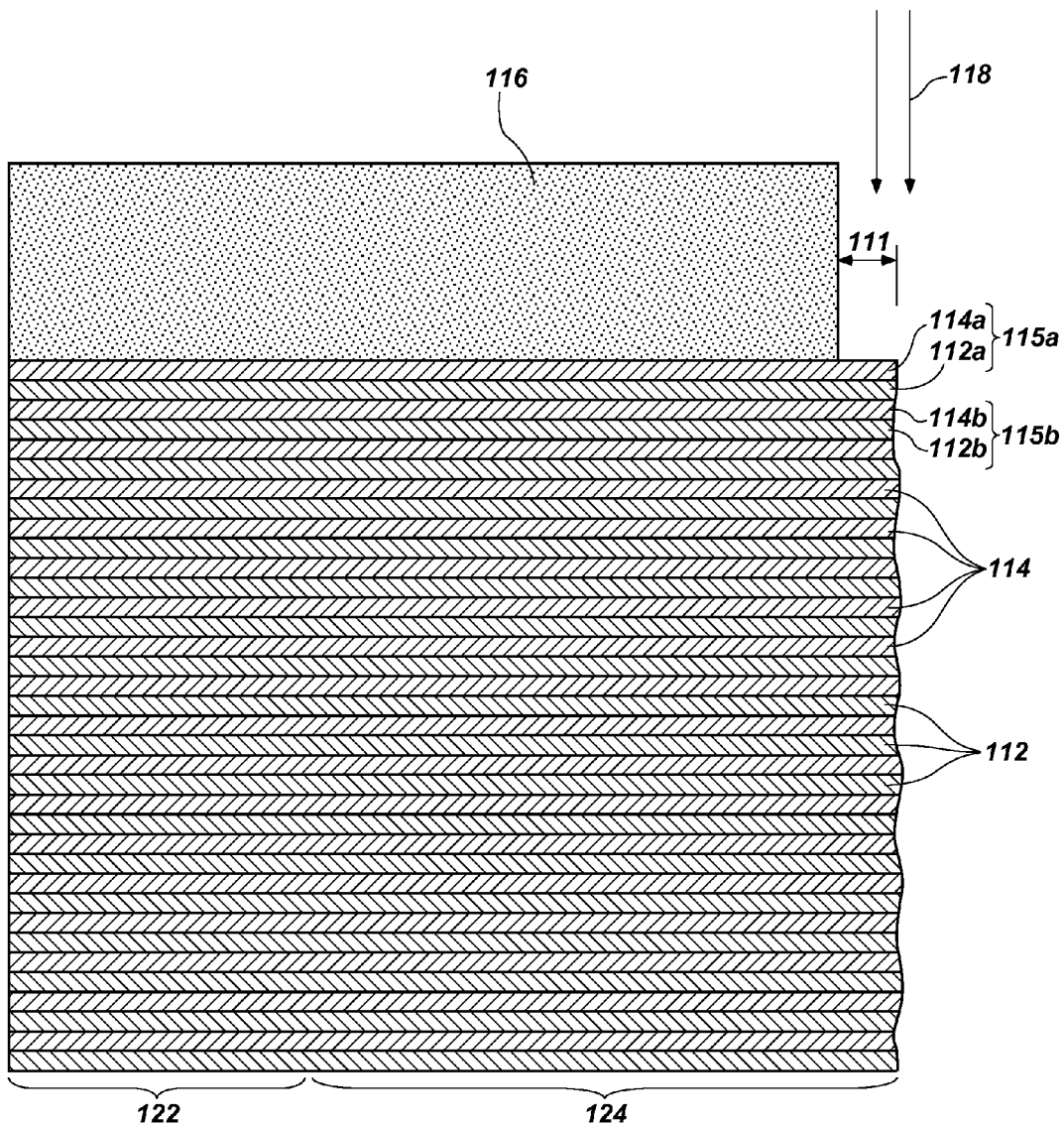
FIGS. 2 through 10 illustrate an embodiment of a process for forming a stair-step structure according to the present disclosure.

FIG. 2 shows eighteen sets 115 of conductive material 112 and insulating material 114 for clarity and ease of understanding of the drawings and related description. However, any number of sets 115 may be used. In other words, fewer or more sets 115 may be used without exceeding the scope of the present disclosure. By way of example and not limitation, a total of thirty-six conductive materials 112 and insulating materials 114 may be foamed to produce the eighteen sets 115. Each of the conductive materials 112 may have the same or a different composition and each of the insulating materials 114 may have the same or a different composition. Furthermore, although each conductive material 112 may be referred to herein in the singular form, for convenience, the conductive material 112 of each set 115 may include one or more conductive materials. Similarly, the insulating material 114 of each set may include one or more insulating materials. For example, the conductive material 112 of a first set 115 may include a first conductive material formed on a second conductive material. The first and second conductive materials of the conductive material 112 of the first set 115 may be separated from the conductive material(s) 112 of an adjacent second set 115 by an insulating material(s) 114.

The alternating conductive materials 112 and insulating materials 114 may include an array region 122 (e.g., a vertical memory array region) and a stair-step region 124 (i.e., a region that may include a stair-step after further processing) of a vertical memory device. The conductive material 112 may be formed from any suitable conductive material(s). By way of example and not limitation, the conductive material 112 may include one or more of polysilicon and a metal, such as tungsten, nickel, titanium, platinum, aluminum, gold, tungsten nitride, tantalum nitride, titanium nitride, etc. The insulating material 114 may be formed from any suitable insulating material(s). By way of example and not limitation, the insulating material 114 may include a silicon oxide (e.g., $SiO_2$). Each set 115 of conductive material 112 and insulating material 114 may have a thickness that is approximately 1 µm. Each of the conductive material 112 and insulating material 114 may be formed by conventional techniques, which are not described in detail herein.

The method may include forming the alternating conductive material 112 and the insulating material 114 in a different order than that shown in FIG. 2. For example, in some embodiments, each set 115 may include a conductive material 112 with an insulating material 114 formed thereover (i.e., on a side opposite the substrate, as shown in FIG. 2) while in other embodiments, each set 115 may include a conductive material 112 with an insulating material 114 formed thereunder (i.e., on the same side of the conductive material 112 as the substrate, not shown). A vertical memory device resulting from such a switched configuration may have little or no difference in terms of functionality or operability as compared to a vertical memory device formed by the method shown in FIGS. 2 through 9.

A first mask 116 may be formed over the topmost set 115a of conductive material 112a and insulating material 114a. The first mask 116 may be referred to as a stair-step mask, as it is used to form a plurality of steps (e.g., contact regions) in the conductive material 112 and insulating material 114. The first mask 116 may be formed of a photoresist material, for example. The first mask 116 may be patterned, as is known in the art, to remove material from the first mask 116 at an outer edge of the stair-step region 124. The material may be removed from the first mask 116 to expose a portion of a major surface of the topmost insulating material 114a in the stair-step region 124 that has a width 111 of approximately a desired width of the step to be formed. By way of example, a final stair-step structure (described in more detail below) to be formed by this method may include individual steps, each exhibiting a width 111 sufficient to provide space for a conductive contact to be formed thereon. For example, the desired width of a step may be in a range of from about 100 nm to about 500 nm. Therefore, the width 111 may be from about 100 nm to about 500 nm. In some embodiments, the width 111 may be from about 220 nm to about 250 nm. However, these particular widths are described by way of example only, and not limitation. The width 111 may be greater or less than the particular widths described.

As used herein, the phrase "to expose" includes to uncover a major surface of a material. For example, the insulating material 114a shown in FIG. 2 includes a portion of a major surface thereof that is exposed.

After the first mask 116 is patterned, the portion of the insulating material 114a exposed through the first mask 116 may be removed by, for example, an anisotropic etch 118. By way of example, the anisotropic etch 118 may include a first dry etch act that removes the exposed portion of the insulating material 114*a* and exposes the conductive material 112*a*, followed by a second dry etch act that removes a portion of the conductive material 112*a* that was exposed by the first dry etch act. The second dry etch act of the anisotropic etch 118 may expose the insulating material 114*b*. One instance of the first dry etch act and the second dry etch act may be referred to herein as a cycle of the anisotropic etch 118. Since the first dry etch act and the second dry etch act remove the portion of the insulating material 114*a* and the portion of the conductive material 112*a*, the first dry etch act and the second dry etch act may remove a portion of the first set 115*a*. Although the method described herein refers to an anisotropic etch 118, the disclosure is not so limited. For example, an isotropic etch may be used in place of the anisotropic etch 118.

The first dry etch act of each cycle of the anisotropic etch 118 may selectively remove the insulating material 114. In other words, the first dry etch act may remove exposed portions of the insulating material 114 and stop removing material once the conductive material 112 is at least partially exposed. The first dry etch act of the anisotropic etch 118 may be performed longer than necessary to ensure that substantially all of the exposed insulating material 114 is removed and the conductive material 112 immediately thereunder is substantially completely exposed. Similarly, the second dry etch act of each cycle of the anisotropic etch 118 may selectively remove the exposed portions of the conductive material 112 and stop removing material once the insulating material 114 immediately thereunder is exposed. The second dry etch act of the anisotropic etch 118 may be performed longer than necessary to ensure that substantially all of the conductive material 112 is removed and the insulating material 114 immediately thereunder is substantially completely exposed. The dry etch acts will be apparent to a person having ordinary skill in the art and, thus, are not described in detail herein.

Figure 3:
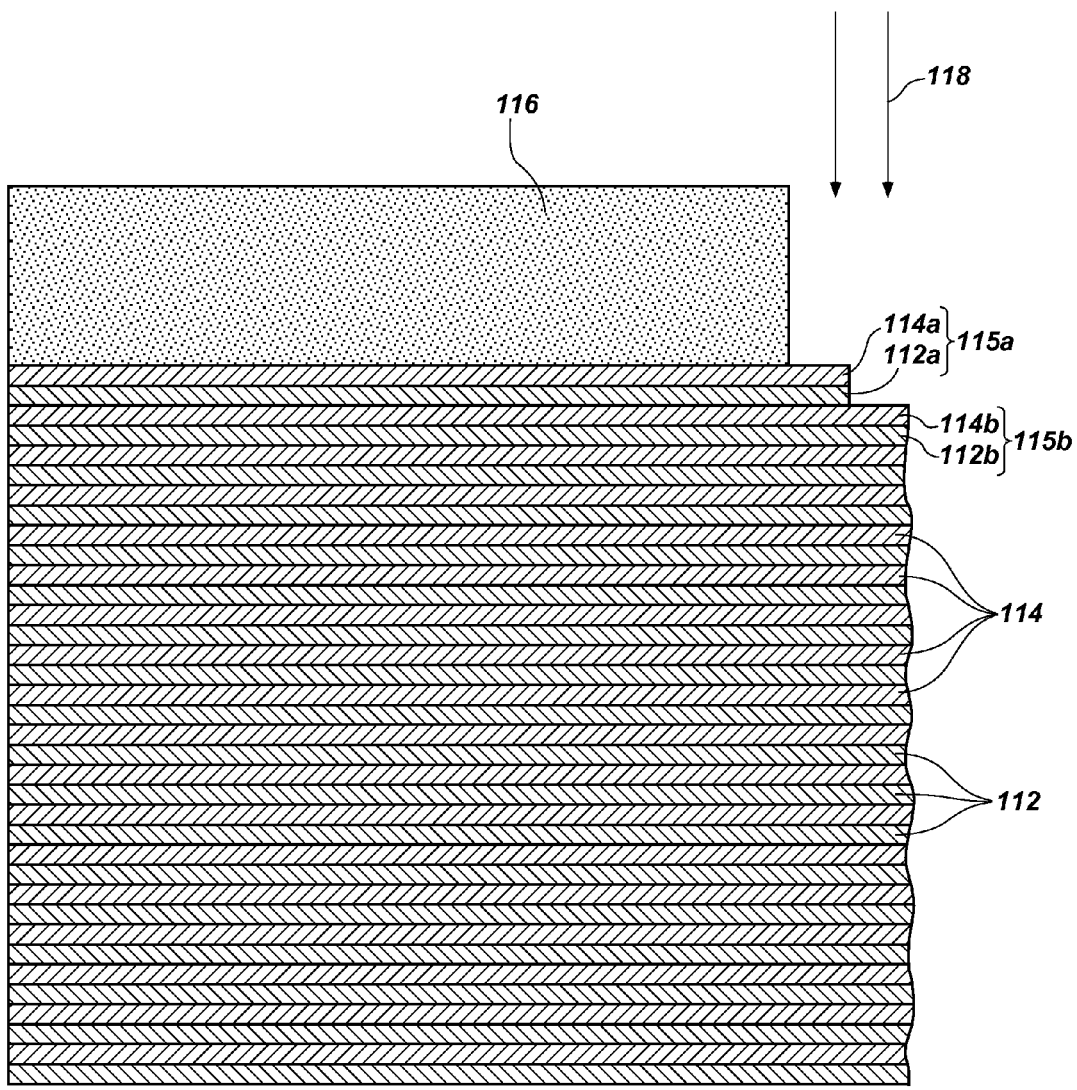
Figure 4:
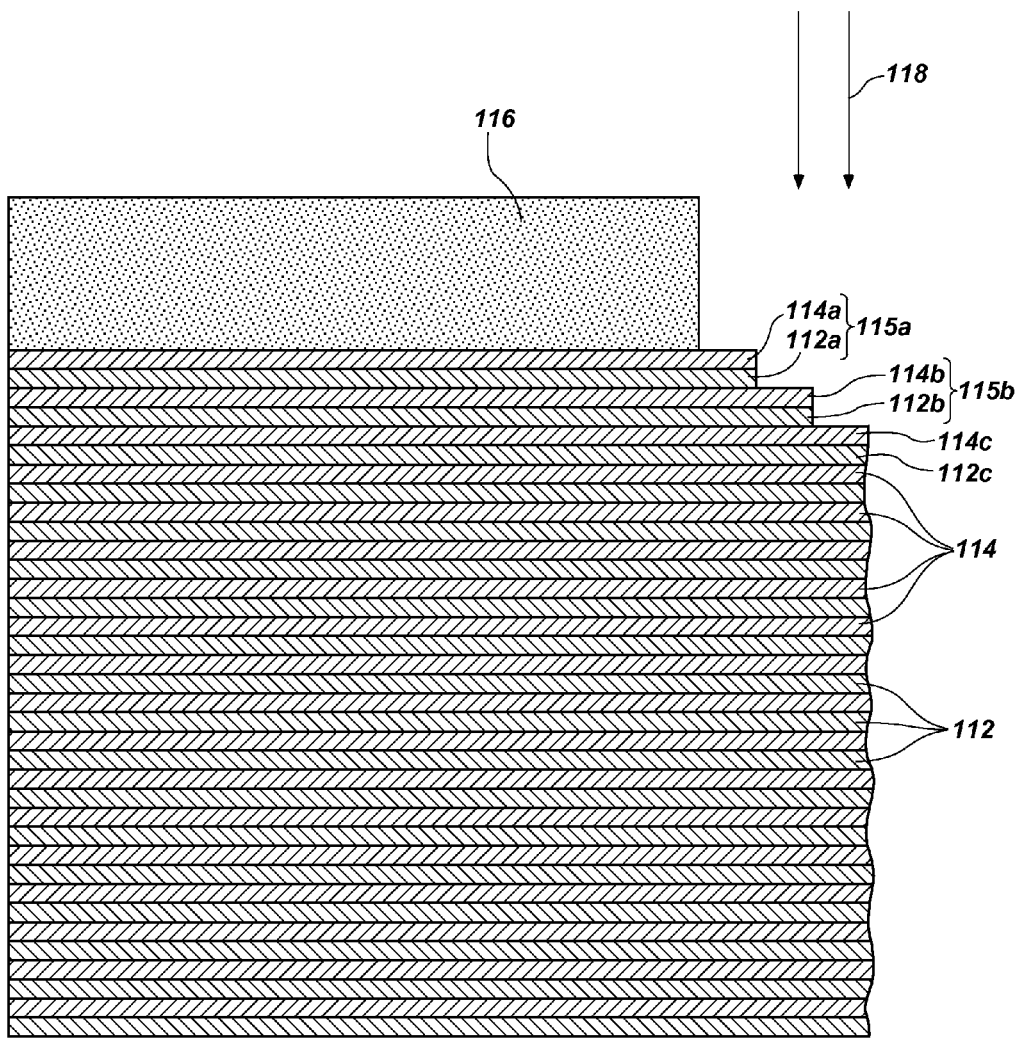

A portion of the first mask 116 may then be removed to expose another portion of the first insulating material 114*a*, resulting in the structure shown in FIG. 3. The portion of the first mask 116 may be removed by, for example, an isotropic etch that is selective to the material of the first mask 116 and that does not substantially remove the material of the insulating material 114 or the conductive material 112. Material from the first mask 116 may be removed to the extent that the portion of the first insulating material 114*a* that is exposed exhibits a width that is approximately a desired width of a step, as described above.

Another anisotropic etch 118 may be used to remove exposed portions of the insulating materials 114*a* and 114*b* and subsequently exposed portions of the conductive materials 112*a* and 112*b* thereunder. In other words, exposed portions of the set 115*a* and the set 115*b* may be removed by one cycle of the anisotropic etch 118. A portion of the first mask 116 may be removed again to expose yet another portion of the insulating material 114*a*, resulting in the structure shown in FIG. 4.

Figure 5:
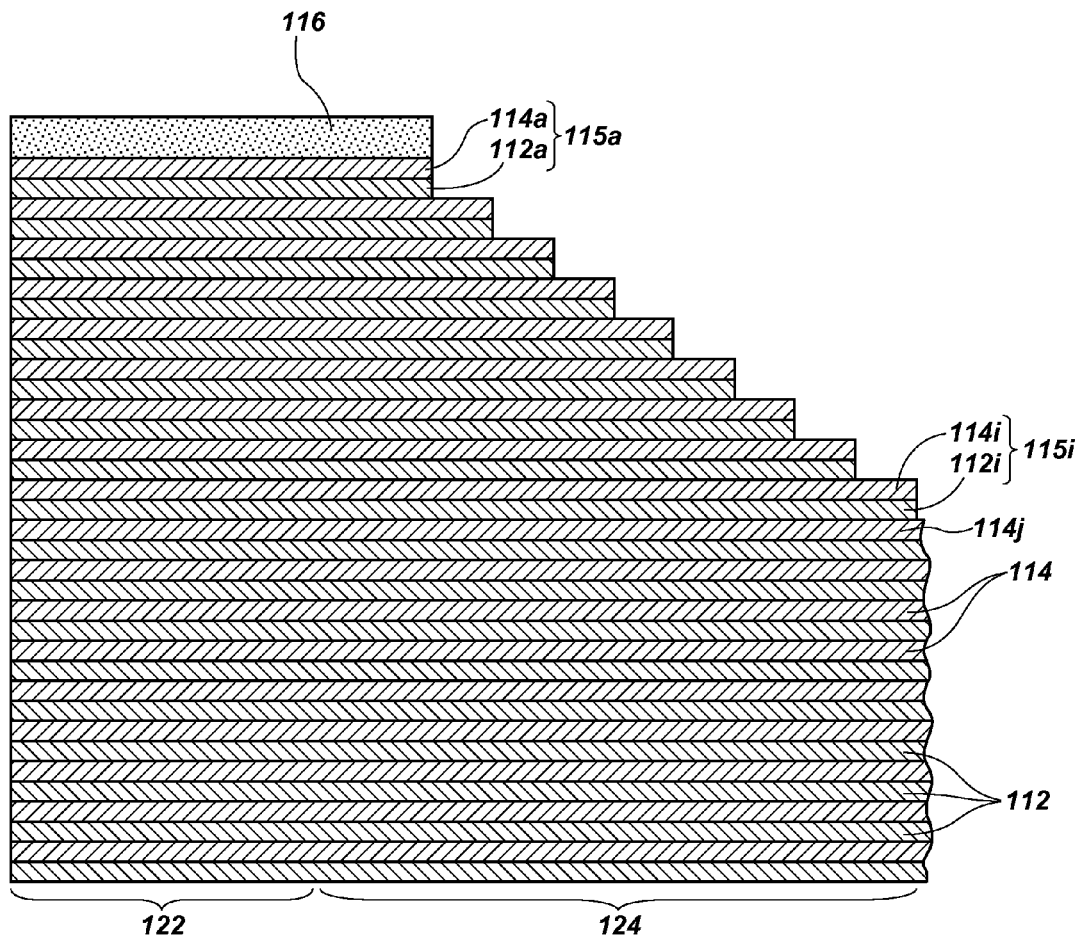

The acts of removing a portion of the first mask 116, removing the exposed insulating material 114, and removing the exposed conductive material 112 may be repeated a plurality of times to expose insulating material 114*j* and form steps in sets 115*a* through 115*i*, which covers one-half of the total number of sets 115, as shown in FIG. 5. In other words and by way of example, where the total number of sets 115 is eighteen, the ninth insulating material 114*i* (when counting sequentially starting with insulating material 114*a*) may have an exposed step formed therein, while the tenth insulating material 114*j* thereunder may not have a step formed therein. The tenth insulating material 114*j* may have a portion thereof exposed. The remainder of the first mask 116 may then be removed by conventional techniques, which are not described in detail herein. By way of example, the first mask 116 may be substantially removed from the surface of the first insulating material 114*a* with a dry or wet etch act.

Figure 6:
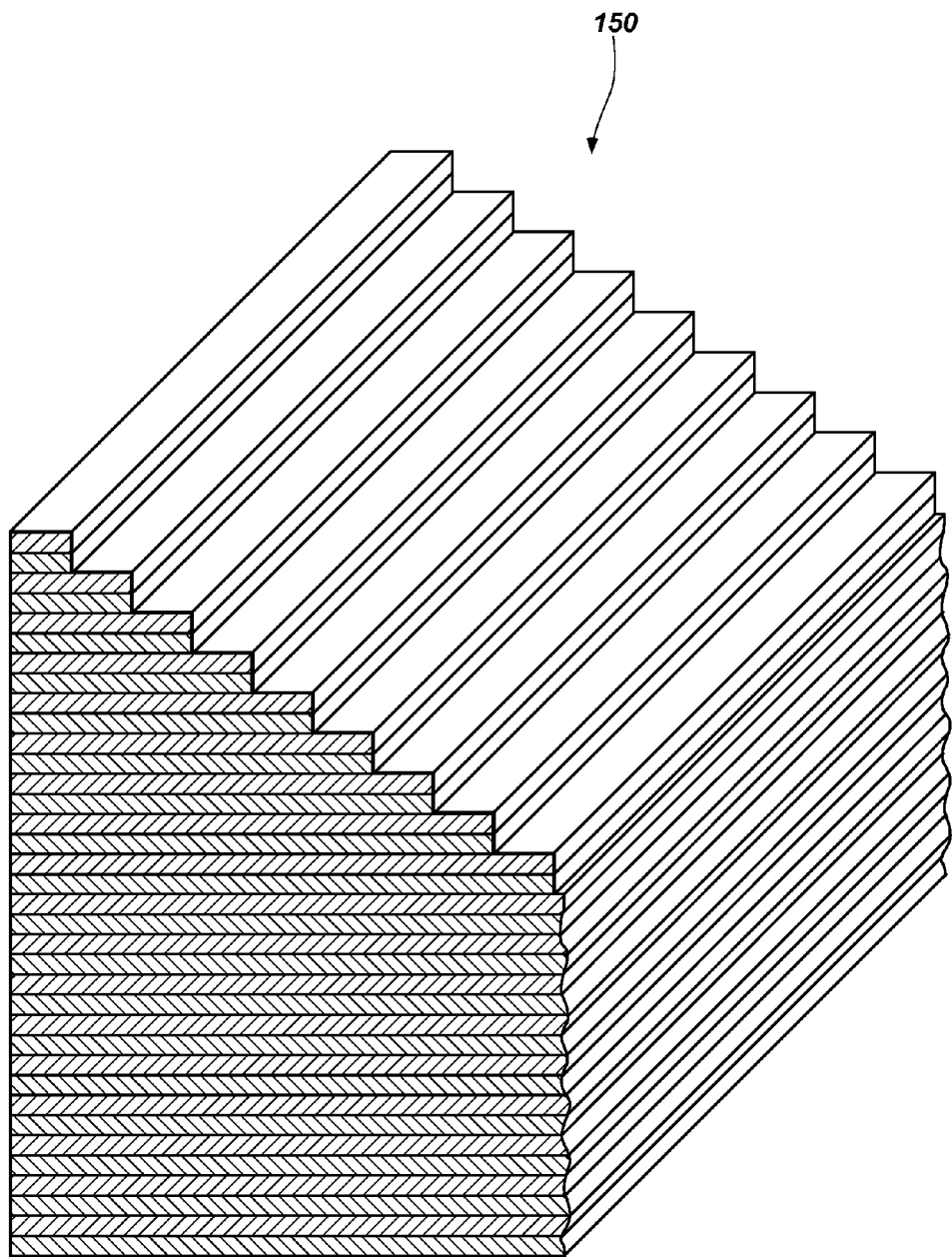

As can be seen in FIG. 6, an intermediate stair-step structure 150 may be formed in which half the number of sets 115 of the total number of sets 115 includes steps formed therein. By way of example and as shown in FIG. 6, for a structure with eighteen sets 115, the method as described may be used to form an intermediate stair-step structure 150 with nine sets 115 having steps formed therein, while the remaining nine sets 115 do not include steps formed therein.

Referring now to FIG. 7, a second mask 126 (also referred to as a "chop mask 126") may be formed over the insulating materials 114*a* through 114*i* and patterned to cover the array region 122 (not shown in FIG. 7) and a first region 170 of the stair-step region 124, while leaving a second region 180 of the stair-step region 124 exposed. The second region 180 may be a region that is laterally (i.e., in the direction of the arrows 140 in FIG. 7) adjacent the first region 170. By way of example, the second region 180 may have a length 182 determined by the configuration and size of word lines that will eventually connect to the stair-step structure 100 by way of word line contacts. In an embodiment where each set 115 has a thickness of about 1 μm, the length 182 exposed through the mask 126 may be about 3 μm.

Figure 8:
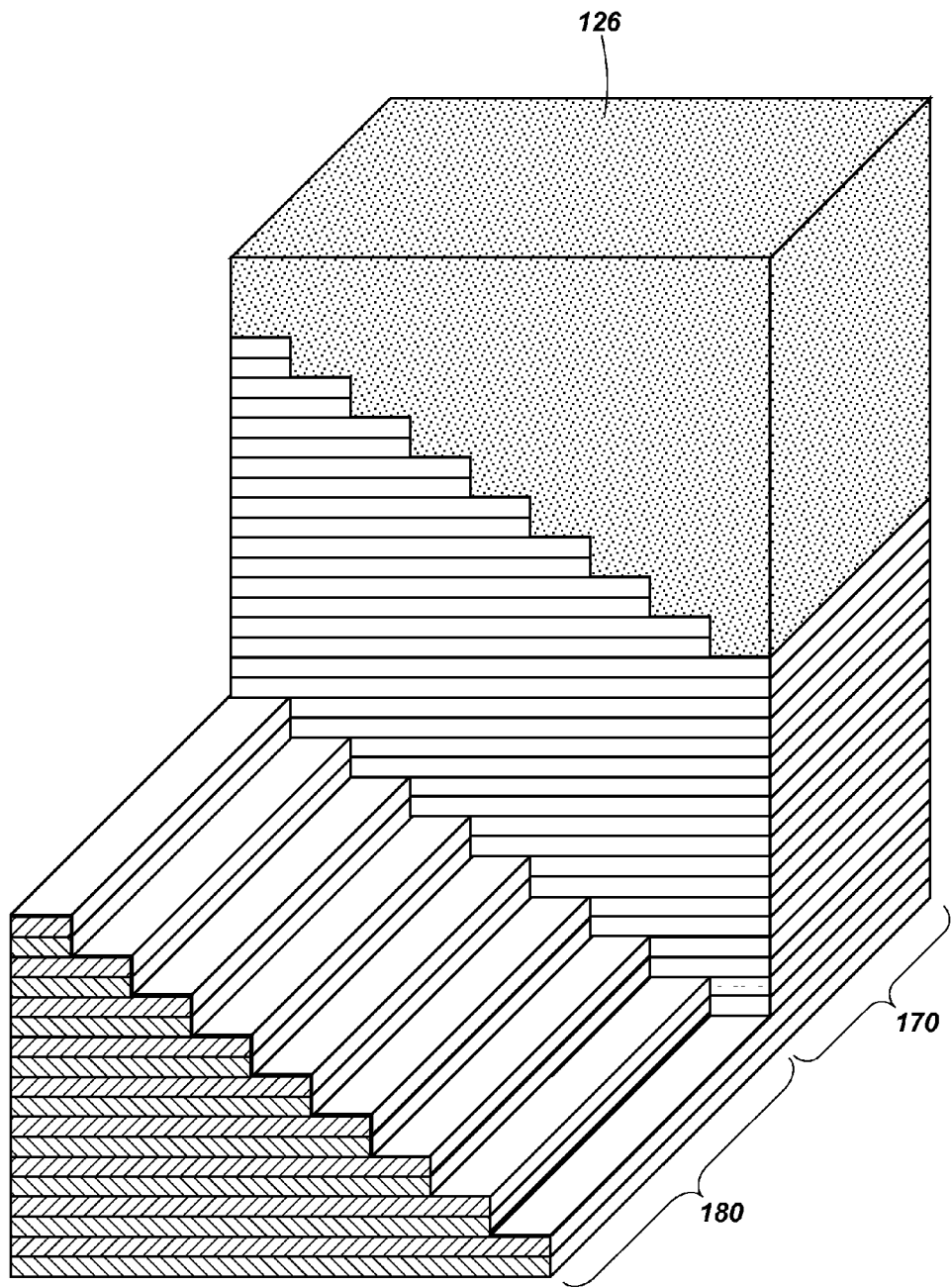

The second region 180 may then be subjected to an anisotropic etch 128, including enough cycles to remove material from a number of sets 115 to expose the sets 115 of the bottom half of the stack, as shown in FIG. 8. By way of example, the anisotropic etch 128 may include: a first dry etch act that selectively removes exposed portions of the insulating material 114; a second dry etch act that removes portions of the conductive material 112 that are exposed by the first dry etch act; a third dry etch act that removes portions of the insulating material 114 that are exposed by the second dry etch act; and so forth until the desired amount of material is removed. By way of non-limiting example and as shown in FIGS. 7 and 8, the anisotropic etch 128 may be repeated in situ nine times to remove portions of nine exposed sets 115.

Figure 9:
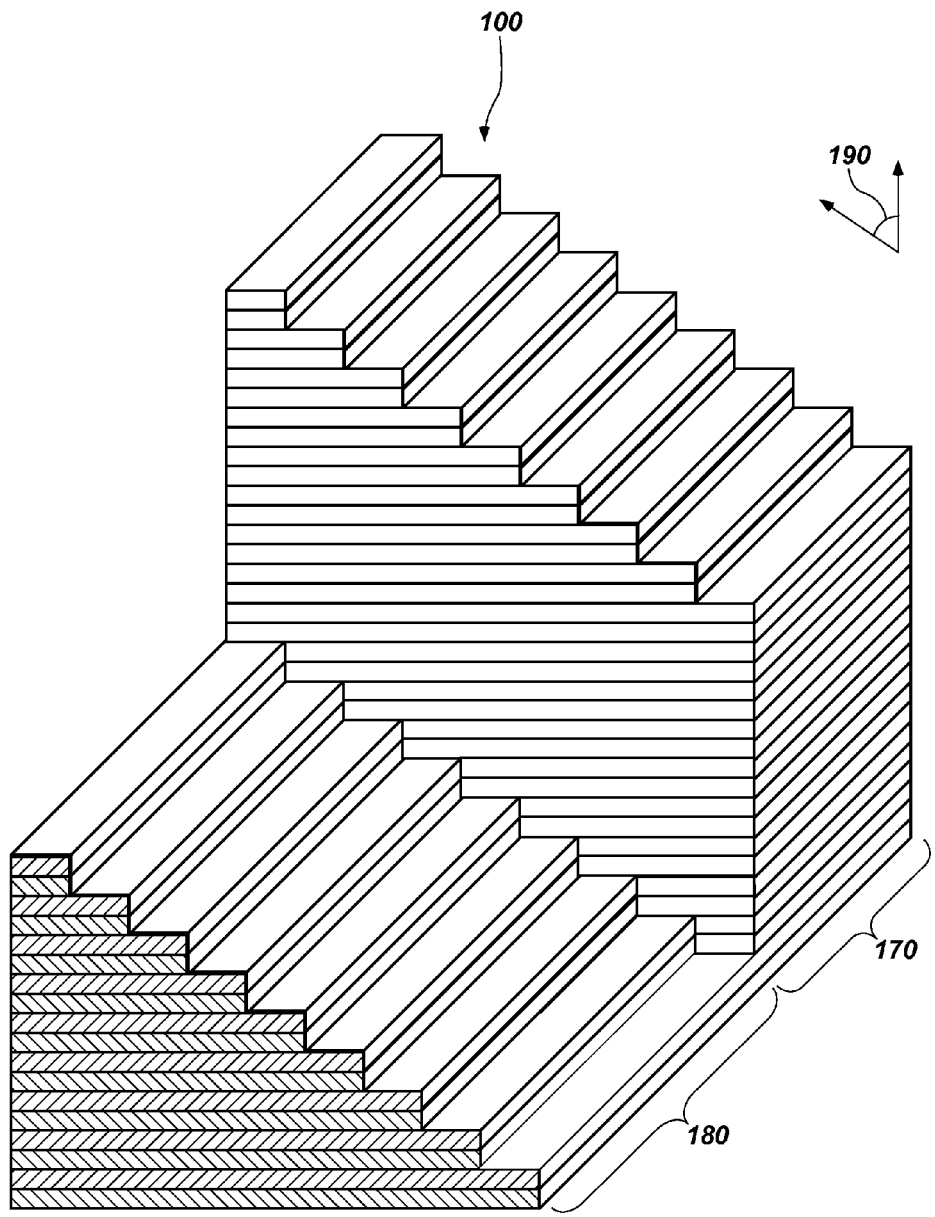

As can be seen in FIG. 9, the second mask 126 may be removed, providing access (i.e., exposure) to each set 115 and forming a stair-step structure 100. The stair-step structure 100 may include a first region 170 providing exposure to a first half of the sets 115 and a second region 180 laterally adjacent the first region 170 providing exposure to a second half of the sets 115. Thus, each set 115 may be accessible to form a conductive contact thereon electrically connected to each conductive material 112, respectively. In other words, an exposed portion of each set 115 may be referred to as a "contact region." Each contact region may be offset from other contact regions. As used herein, the term "offset" includes located at a different distance from a substrate. For example, a first contact region offset from a second contact region may refer to the contact region of a first set and the contact region of a second set different from the first set, as shown in FIG. 9. The contact regions of the stair-step structure 100 may extend at an angle 190 from the substrate, as will be explained in more detail below.

Figure 10:
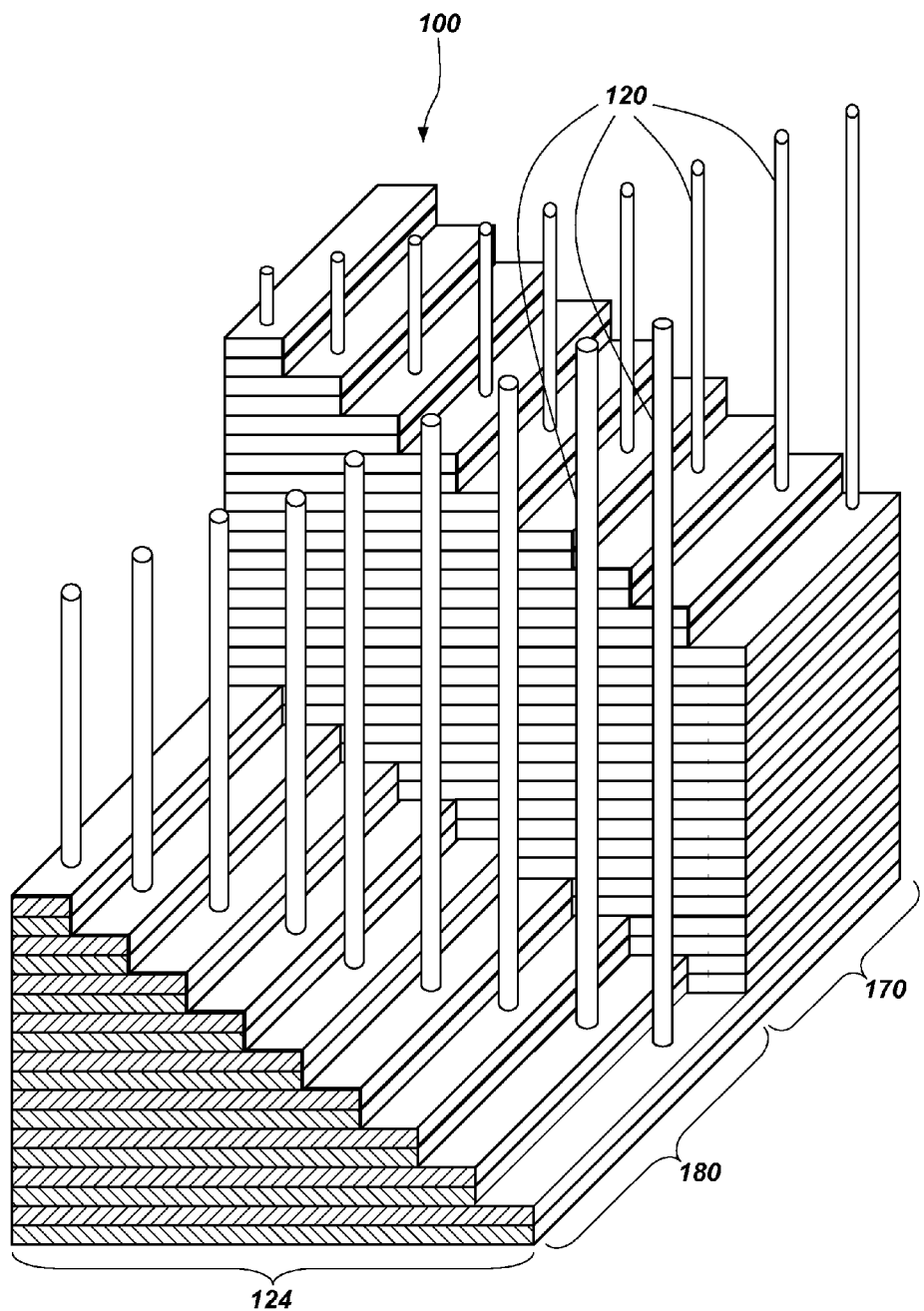

Referring now to FIG. 10, conductive contacts 120 may be formed to provide electrical contact to each conductive material 112. By way of example, a second insulating material (not shown), such as one or more of a silicon oxide, borophosphosilicate glass (BPSG), and a spin-on dielectric (SOD), may be formed over the stair-step region 124. The second insulating material may optionally be planarized by, for example, an abrasive planarization process, such as a chemical-mechanical polishing (CMP) process or a mechanical polishing process. Openings may be formed through the second insulating material and through the insulating material 114 (where the insulating material 114 covers the top of each contact area of the stair-step structure 100, as shown in FIG. 10) to expose the underlying conductive materials 112. The openings may then be filled with a conductive material (e.g., polysilicon, tungsten, titanium, aluminum, etc.) to form the conductive contacts 120 that electrically connect to the conductive materials 112, respectively, as shown in FIG. 10. By way of example, the conductive contacts 120 may be word line contacts. Conductive word lines may then be formed (not shown) and connected to each word line contact 120. The length 182 (see FIG. 7) of the second region 180 of the stair-step region 124 may be chosen to provide sufficient space for the word lines and word line contacts 120 to be formed and electrically isolated from one another.

Alternatively, the conductive contacts 120 may be formed to have a configuration different than that shown in FIG. 10. By way of example, the conductive contacts 120 may be formed to extend from each conductive material 112 through the stair-step structure 100 to the substrate rather than or in addition to away from the substrate. For example, U.S. patent application Ser. No. 13/151,945, filed Jun. 2, 2011, now U.S. Pat. No. 8,765,598, issued Jul. 1, 2014, and assigned to the Assignee of the present application, describes contacts extending toward the substrate through a stair-step structure and methods of forming such contacts. In other words, this disclosure is not limited to forming contacts extending from the materials of the stair-step structure 100 in a direction away from the substrate, as shown in FIG. 10.

The method illustrated in FIGS. 2 through 10 results in a stair-step structure 100 having two distinct regions 170 and 180. The first region 170 of the stair-step structure 100 includes contact areas allowing electrical access to a first portion of the sets 115 of insulating materials 114 and conductive materials 112. The second region 180 of the stair-step structure 100 is laterally adjacent the first region 170 and includes contact areas allowing electrical access to a second portion of the sets 115. The first region 170 may include contact areas of one-half of the sets 115 and the second region 180 may include contact areas of the other half of the sets 115.

By utilizing the embodiment illustrated in FIGS. 2 through 10 and described in the accompanying text, a stair-step structure 100 may be formed to provide access to each set 115. The stair-step structure 100 extends only half as far out from the array region 122 (see FIG. 5) as compared to prior art stair-step structures having the same number of sets of insulating material 114 and conductive material 112, saving space and reducing the size of a memory device including the stair-step structure 100. Additionally, the stair-step structure 100 may be formed proximate another stair-step structure (not shown) of another vertical device. A gap between the two stair-step structures may be smaller than a conventional gap, which may be cheaper and easier to fill with material (e.g., the second insulative material described above) in subsequent steps. Because the resulting fill material would span a shorter distance, planarization of the resulting fill material may be accomplished more easily and controllably. The method described in FIGS. 2 through 10 also may have the advantage of forming a large number of steps while greatly reducing a manufacturing margin of error. By way of example, the act of removing portions of the first mask 116 may be done only eight times to form the eighteen steps of the stair-step structure 100. In contrast, conventional methods may require trimming back of a mask seventeen times to form a stair-step structure with eighteen steps. Any error in trimming the mask may, therefore, be multiplied up to eight times rather than seventeen times, as would be done with conventional methods. In other words, the method described in this disclosure may provide a lower margin of error to form a stair-step structure 100 as compared to a stair-step structure formed by conventional methods. Furthermore, the method described in this disclosure may include forming two masks (first mask 116 and second mask 126) to achieve a manageable margin of error and space savings, rather than using a larger number of masks as would be done with conventional methods. Since each mask may require an additional photolithographic reticle to be formed, the large number of masks adds significant expense to the manufacturing process. Thus, reducing the number of masks used to attain a better margin of error provides cost savings.

Another embodiment of a method for forming a stair-step structure is illustrated in FIGS. 11 through 14. The method may begin in a similar fashion to that illustrated in FIGS. 2 through 6 to form an intermediate stair-step structure 250. However, the intermediate stair-step structure 250 of this embodiment is different than the intermediate stair-step structure 150 shown in FIG. 6 because the intermediate stair-step structure 250 includes exposure of, and steps formed in, one-fourth of sets 215 of insulating material 214 and conductive material 212, rather than one-half of the sets 115 as in the intermediate stair-step structure 150 shown in FIG. 6. By way of non-limiting example and for ease of illustration, the structure shown in FIG. 11 includes sixteen total sets 215. However, any desired number of sets 215 may be used. Steps may be formed into the four topmost sets 215 (i.e., one-fourth of the sixteen total sets 215) essentially as described above with reference to FIGS. 2 through 6 to expose the insulating material 214 of each of the four topmost sets 215. A second mask 236 may be foamed over the insulating materials 214a through 214d and patterned to expose the sets in a second region 260 laterally adjacent a first region 240 of the intermediate stair-step structure 250.

Figure 11:
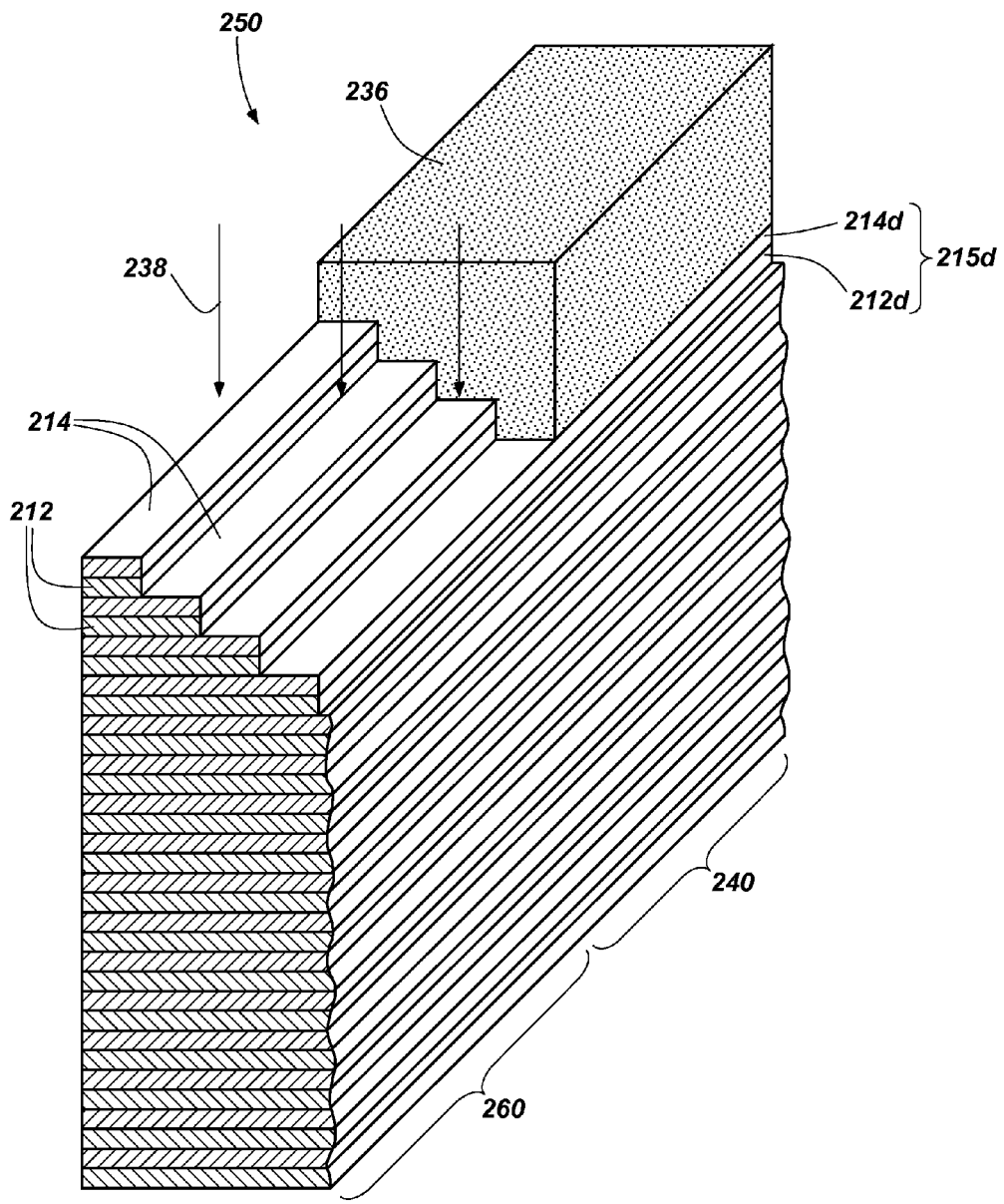
FIGS. 11 through 14 illustrate another embodiment of a process for forming a stair-step structure according to the present disclosure.
Figure 12:
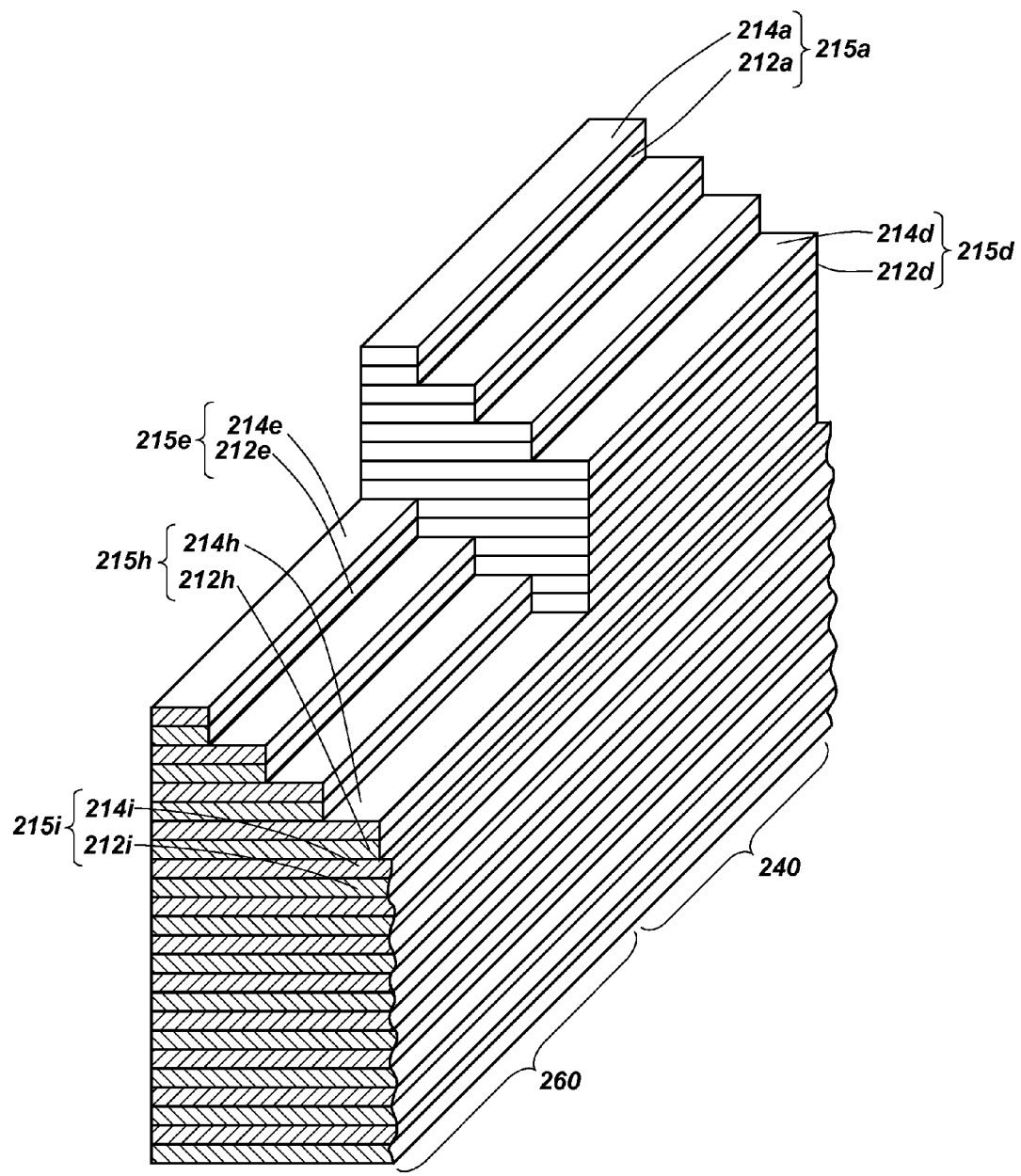

An anisotropic etch 238 may be performed including four cycles of removing insulating material 214 and conductive material 212 to expose and form steps in the next four sets 215 (215e through 215h) in the exposed second region 260, as illustrated in FIGS. 11 and 12. After the anisotropic etch 238 is performed, the second mask 236 may be removed. Thus, the four topmost sets 215a through 215d may be exposed and have steps formed therein in a first region 240 and the next four sets 215e through 215h may be exposed and have steps formed therein in a second region 260 laterally adjacent the first region 240. The bottom half of the sets 215 (i.e., the eight sets 215 below the eighth set 215h in FIG. 12) may not have steps formed therein. The conductive material 214i of the ninth set 215i may have a portion thereof exposed after the formation of a step in the eighth set 215h.

Figure 13:
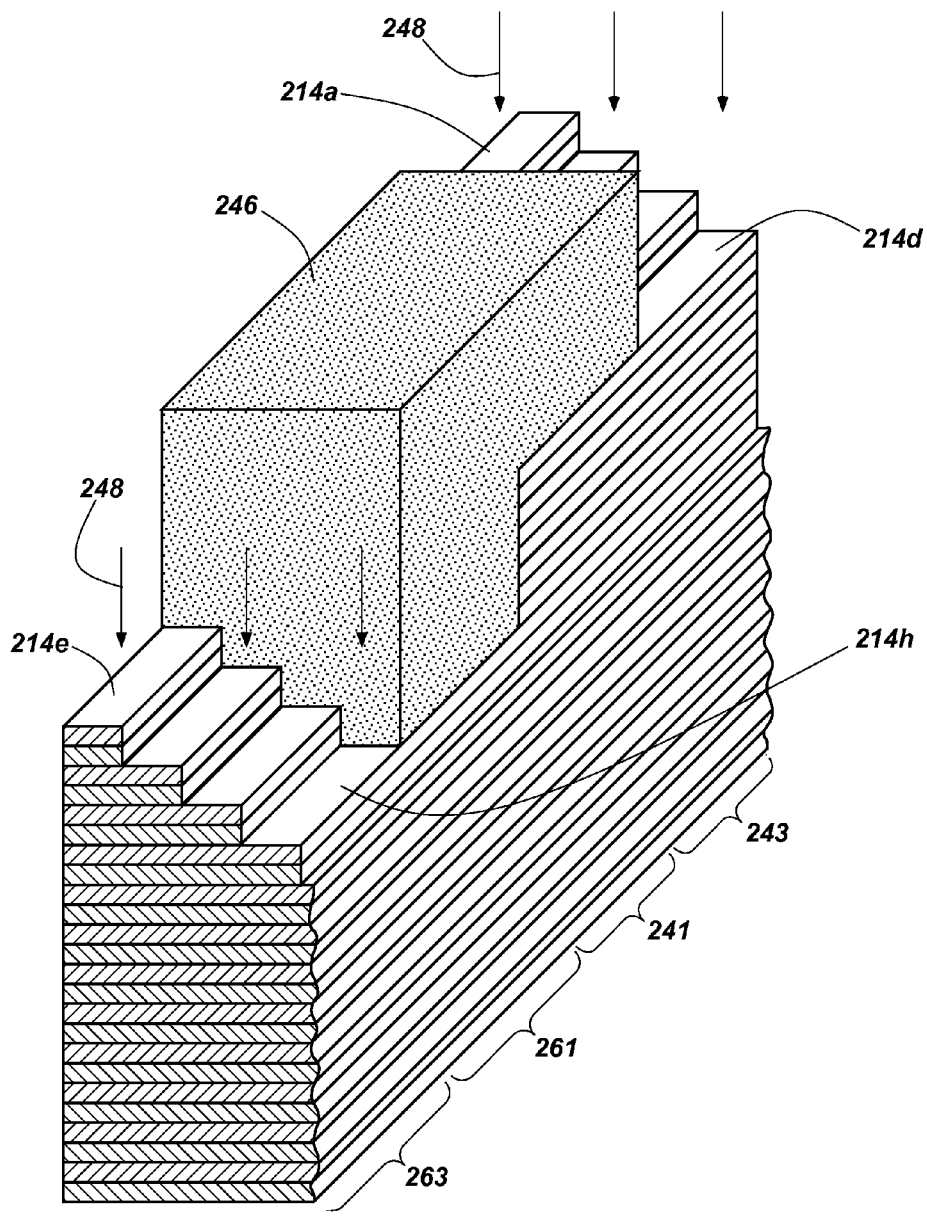

Referring now to FIG. 13, a third mask 246 may be formed over exposed insulating material 214a through 214d of a first portion 241 of the first region 240 (FIG. 12) and over exposed insulating material 214e through 214h of a first portion 261 of the second region 260 (FIG. 12) and patterned to expose a second portion 243 of the first region 240 and a second portion 263 of the second region 260. By way of non-limiting example, about one-half of each of the first region 240 and of the second region 260 may be covered by the third mask 246 while the remaining about one-half may be exposed.

Figure 14:
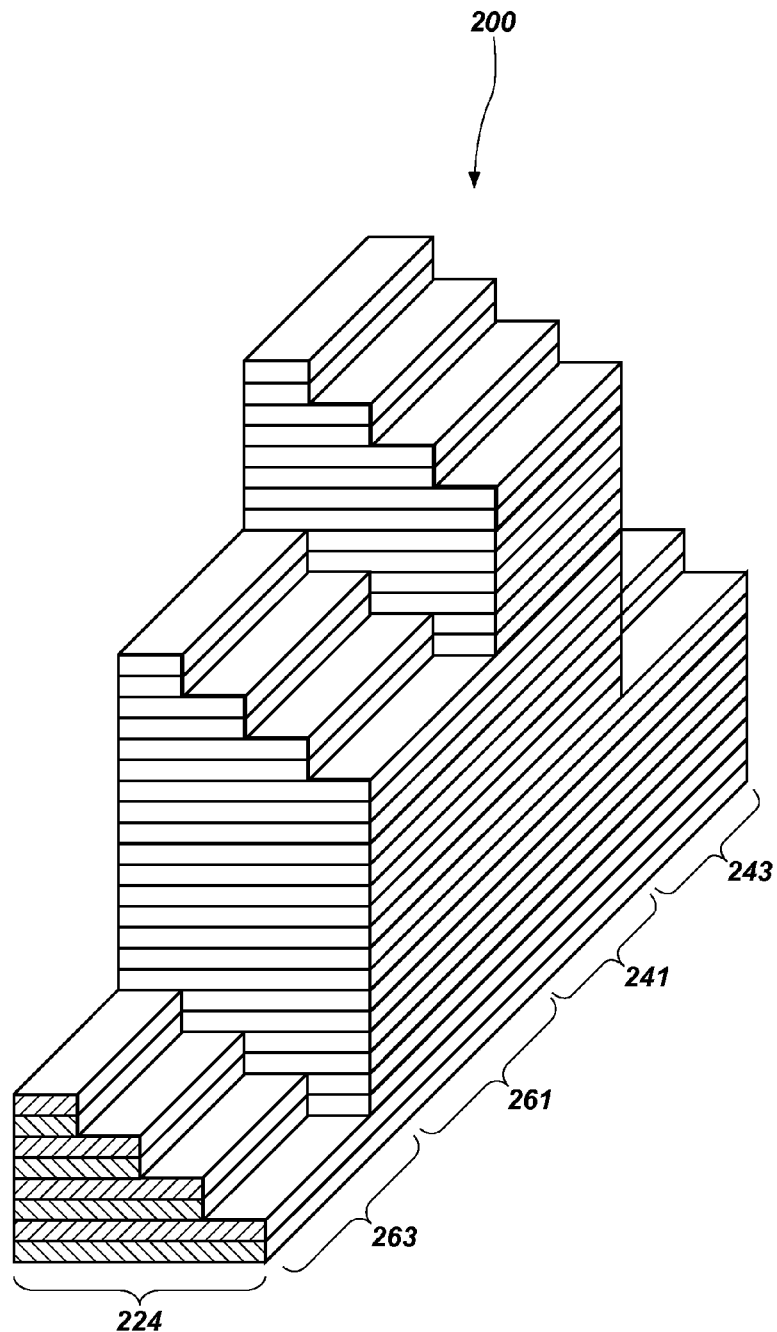

Another anisotropic etch 248 may be conducted to remove the exposed material. By way of example, the anisotropic etch 248 may include eight cycles of removing insulating material 214 and conductive material 212 to remove material from eight sets 215 in each of the exposed portions 243 and 263. As can be seen in FIG. 14, a resulting stair-step structure 200 may include four distinct portions 243, 241, 261, and 263 laterally adjacent one another, each providing exposure to a distinct one-fourth of the total number of sets 215. Conductive contacts (not shown) may then be formed to provide electrical contact with each conductive material 212 essentially as described above with reference to FIG. 10.

It is noted that variations of the embodiment shown in FIGS. 11 through 14 may exist that do not exceed the scope of the present disclosure. For example, the anisotropic etch 238 shown in FIG. 11 may remove eight sets 215 rather than four sets 215 and the anisotropic etch 248 shown in FIG. 13 may remove four sets 215 rather than eight sets 215. Although the number of cycles of each anisotropic etch is changed, a resulting structure may still include four distinct regions that each provides access to one-fourth of the sets 215. It is also noted that the specific number of sets 215 shown in FIGS. 11 through 14 is sixteen for convenience; however, the disclosure is not so limited. A stair-step structure with any desired number of sets 215 of insulating material 214 and conductive material 212 may be formed by the methods disclosed.

The embodiment of the method of the disclosure shown in FIGS. 11 through 14 may provide some advantages over the embodiment illustrated in FIGS. 2 through 10. For example, an even more attainable margin of error may be realized because the first mask (i.e., the stair-step mask) may be trimmed fewer times to gain the same number of contact regions (e.g., steps). In addition, the distance that a stair-step region 224 of the method shown in FIGS. 11 through 14 extends from an array region (e.g., a vertical memory array region) is less than the distance that the stair-step region 124 of the method shown in FIGS. 2 through 10; thus additional space savings may be realized. However, an additional photolithographic reticle may be used to form the third mask 246 shown in FIG. 13 that is omitted in the method shown in FIGS. 2 through 10. Therefore, there may be some additional cost in manufacturing the stair-step structure 200 formed by the method shown in FIGS. 11 through 14. Thus, a method of forming a stair-step structure of the present disclosure may be modified and tailored to the costs and benefits involved in a given situation.

Figure 15:
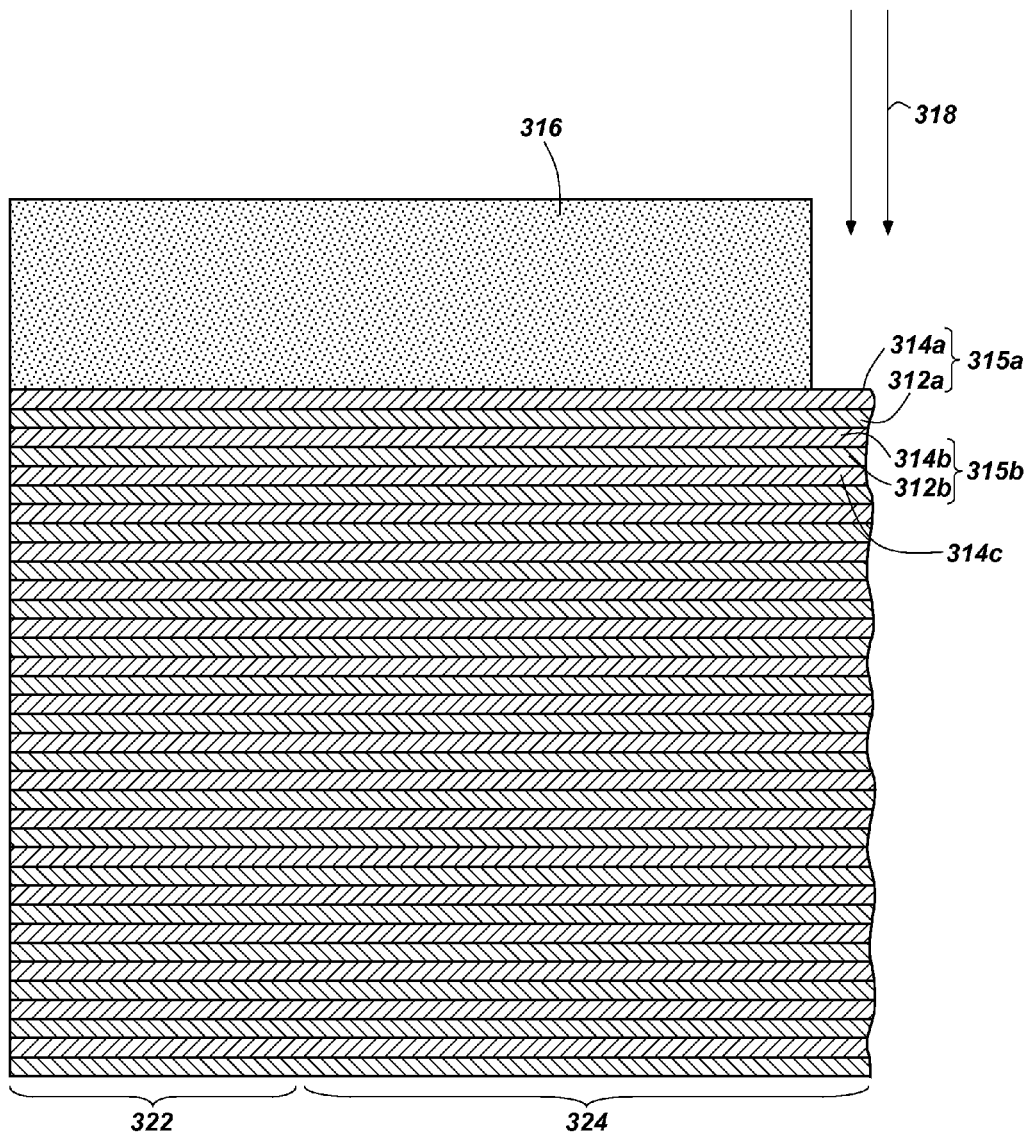
FIGS. 15 through 20 illustrate another embodiment of a process for forming a stair-step structure according to the present disclosure.

Another embodiment of a method of forming a stair-step structure for electrical access to a vertical device (e.g., memory array) is illustrated by way of example in FIGS. 15 through 20. Referring to FIG. 15, a number of sets 315 of alternating conductive material 312 and insulating material 314 may be formed. By way of example and for clarity, eighteen sets 315 are shown, although the disclosure is not so limited. A first mask 316 (also referred to as a "stair-step mask 316") may be formed over insulating material 314a to cover both an array region 322 (e.g., a vertical memory array region) and a stair-step region 324. The first mask 316 may be patterned to expose a portion of the insulating material 314a with a width about the same width as a desired step of a stair-step structure to be formed, essentially as described above with reference to FIG. 2.

An anisotropic etch 318 may be performed to remove a portion of the two uppermost sets 315a and 315b. In other words, the anisotropic etch 318 may remove the exposed portion of the insulating material 314a, the underlying portion of the conductive material 312a, the underlying portion of the next insulating material 314b, and the underlying portion of the next conductive material 312b. In other words, two cycles of the anisotropic etch 318 may be performed to remove portions of two sets 315 of conductive material 312 and insulating material 314, rather than one cycle of anisotropic etching 318 through one set 315. A portion of the first mask 316 may then be removed to expose another portion of the insulating material 314a, essentially as described above with reference to FIG. 2.

Figure 16:
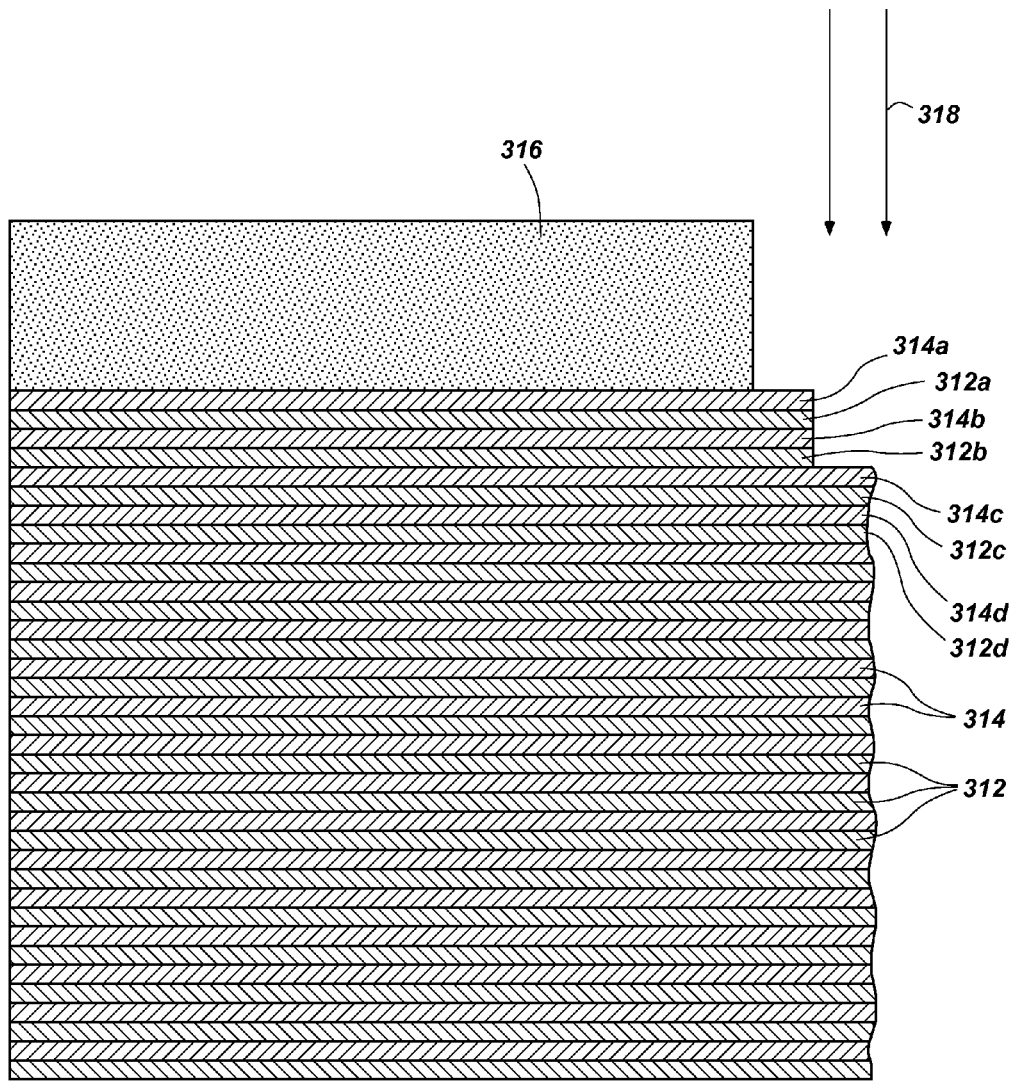
Figure 17:
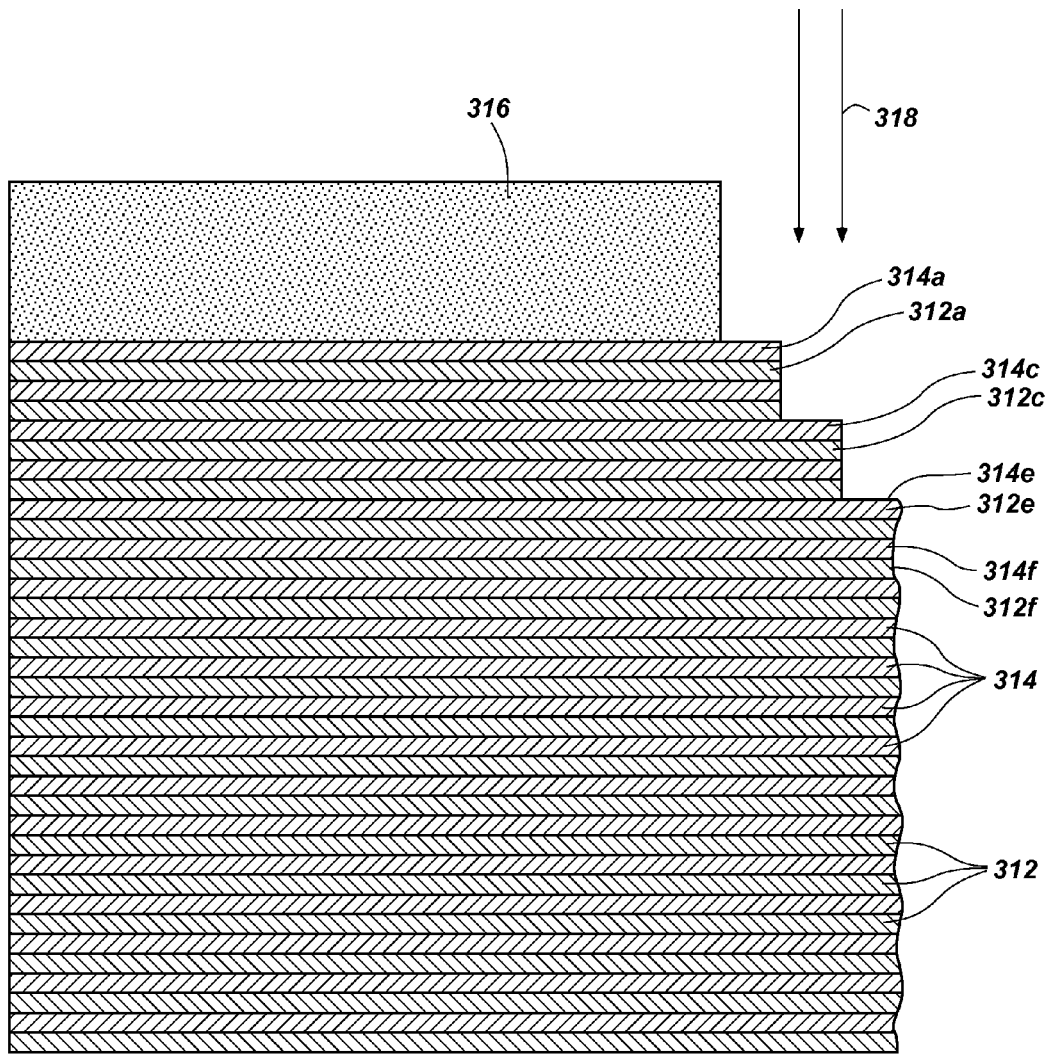
Figure 18:
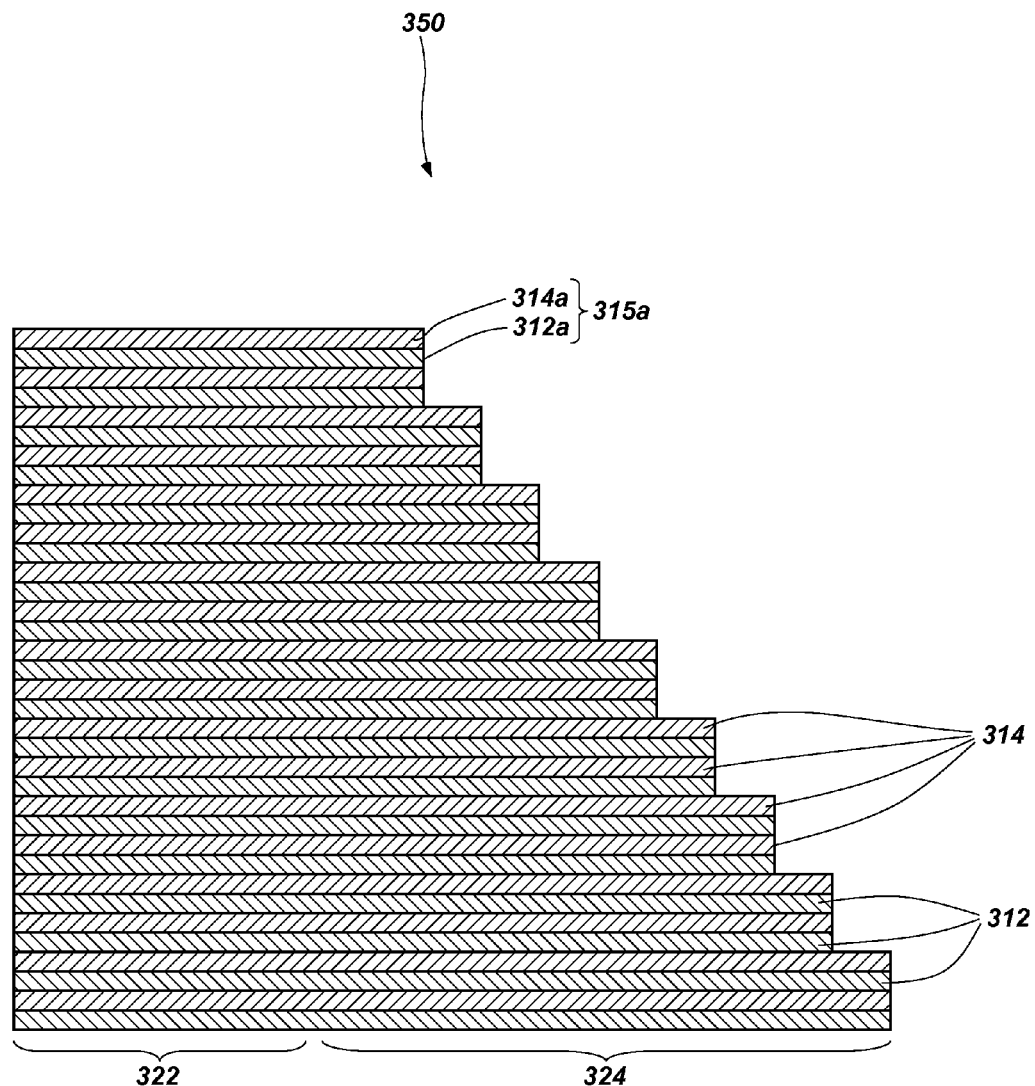

Referring now to FIG. 16, a portion having a width of about one desired step width of the insulating material 314a may be exposed as well as a similar portion of the third insulating material 314c. Another anisotropic etch 318 may be performed, again etching through two sets 315 of conductive material 312 and insulating material 314. Another portion of the first mask 316 may be removed through an isotropic etch, resulting in the structure shown in FIG. 17. The sequential anisotropic etching 318 and removal of portions of the first mask 316 may continue until steps have been formed in a desired fraction, such as one-half, of the sets 315 and an intermediate stair-step structure 350 is formed, as shown in FIG. 18. In other words, every other set 315 (when proceeding from a substrate towards a topmost set 315a) may have at least a portion of its insulating material 314 exposed, the exposed portion having a width sufficient to form a conductive contact thereon or therethrough.

Figure 19:
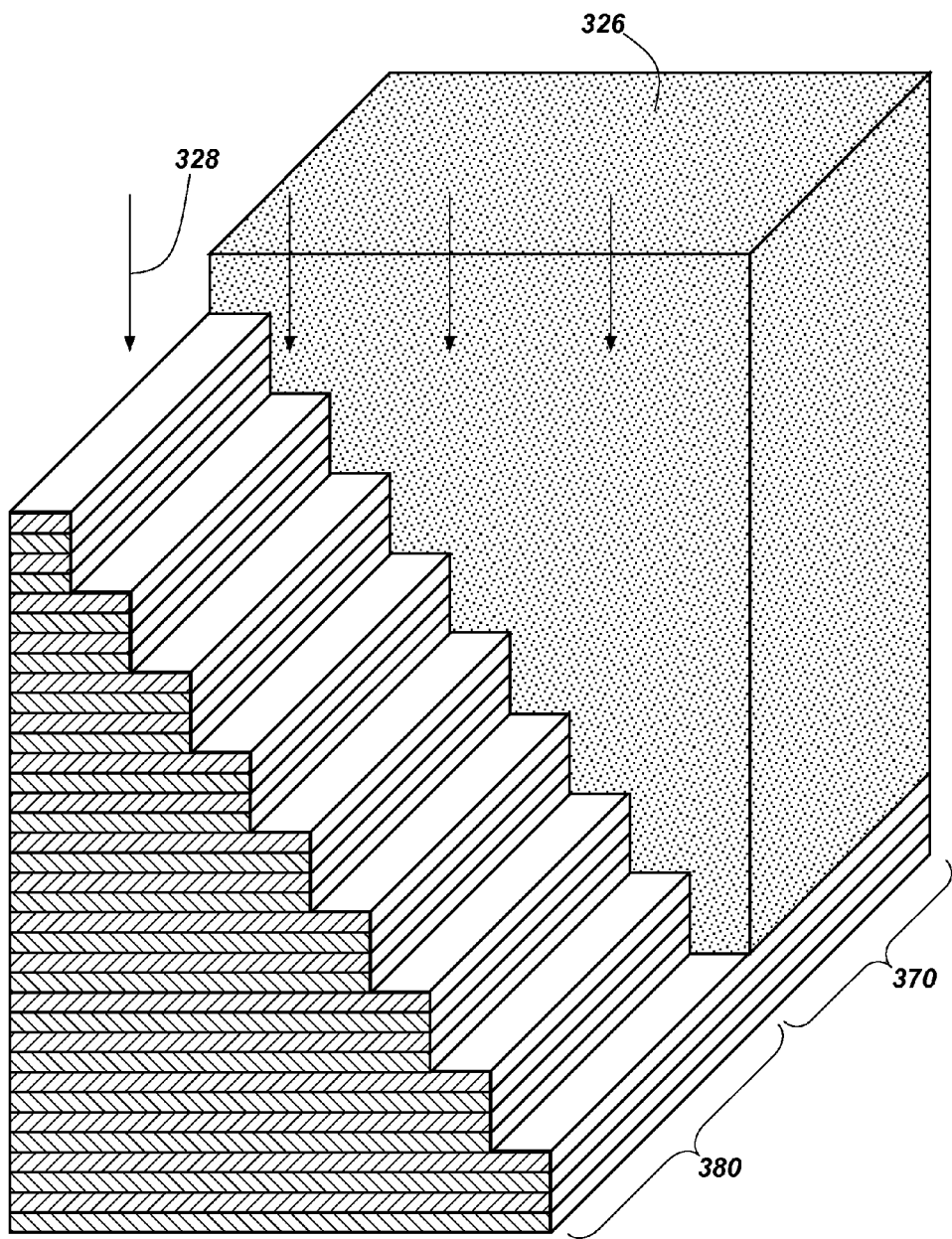

Referring now to FIG. 19, a second mask 326 (also referred to as a "chop mask 326") may be formed over the exposed insulating materials 314 and patterned to cover a first region 370 of the stair-step region 324 and to expose a second region 380 laterally adjacent the first region 370. One cycle of another anisotropic etch 328 may be performed on the exposed second region 380 to remove an exposed portion of one set 315 from each step. In other words, the anisotropic etch 328 may remove exposed insulating material 314 from each of the exposed sets 315 and then may remove underlying conductive material 312 from each of the exposed sets 315. In this manner, the sets 315 that were not exposed in the intermediate stair-step structure 350 shown in FIG. 18 may be exposed by performing one cycle of the anisotropic etch 328.

Figure 20:
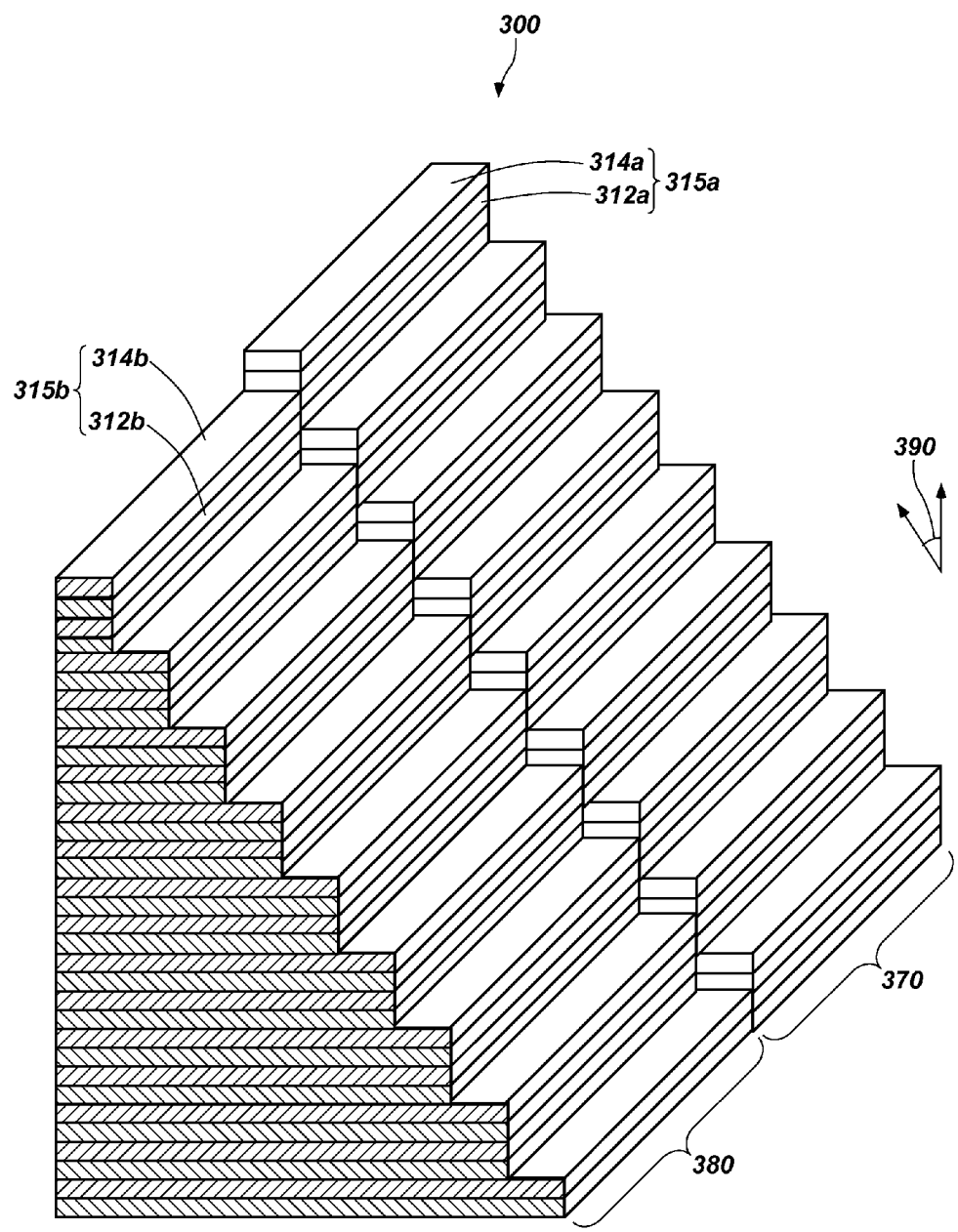

The second mask 326 may be removed, resulting in the stair-step structure 300 shown in FIG. 20. The stair-step structure 300 may include a first region 370 providing exposure of (i.e., access to) one-half of the sets 315. The first region 370 may provide exposure of every other set 315. The stair-step structure 300 may also include a second region 380 laterally adjacent the first region 370 providing exposure of the other half of the sets 315.

An angle 390 of a stair-step structure 300 formed by the method illustrated in FIGS. 15 through 20 may be less than an angle 190 of a stair-step structure 100 formed by the method illustrated in FIGS. 2 through 10. A device including a stair-step structure 300 may also include another stair-step structure (not shown) facing the first. A steeper stair-step structure (i.e., a smaller angle) may result in a valley between neighboring stair-step structures with less width than a valley between stair-step structures that are less steep (i.e., having a larger angle). A valley having such a smaller width may be easier, and therefore cheaper, to fill with dielectric or other desired materials. A valley with a smaller width filled with dielectric or other desired material may also be easier to planarize, such as before forming contacts providing electrical connection to the conductive materials of the stair-step structure.

Figure 21:
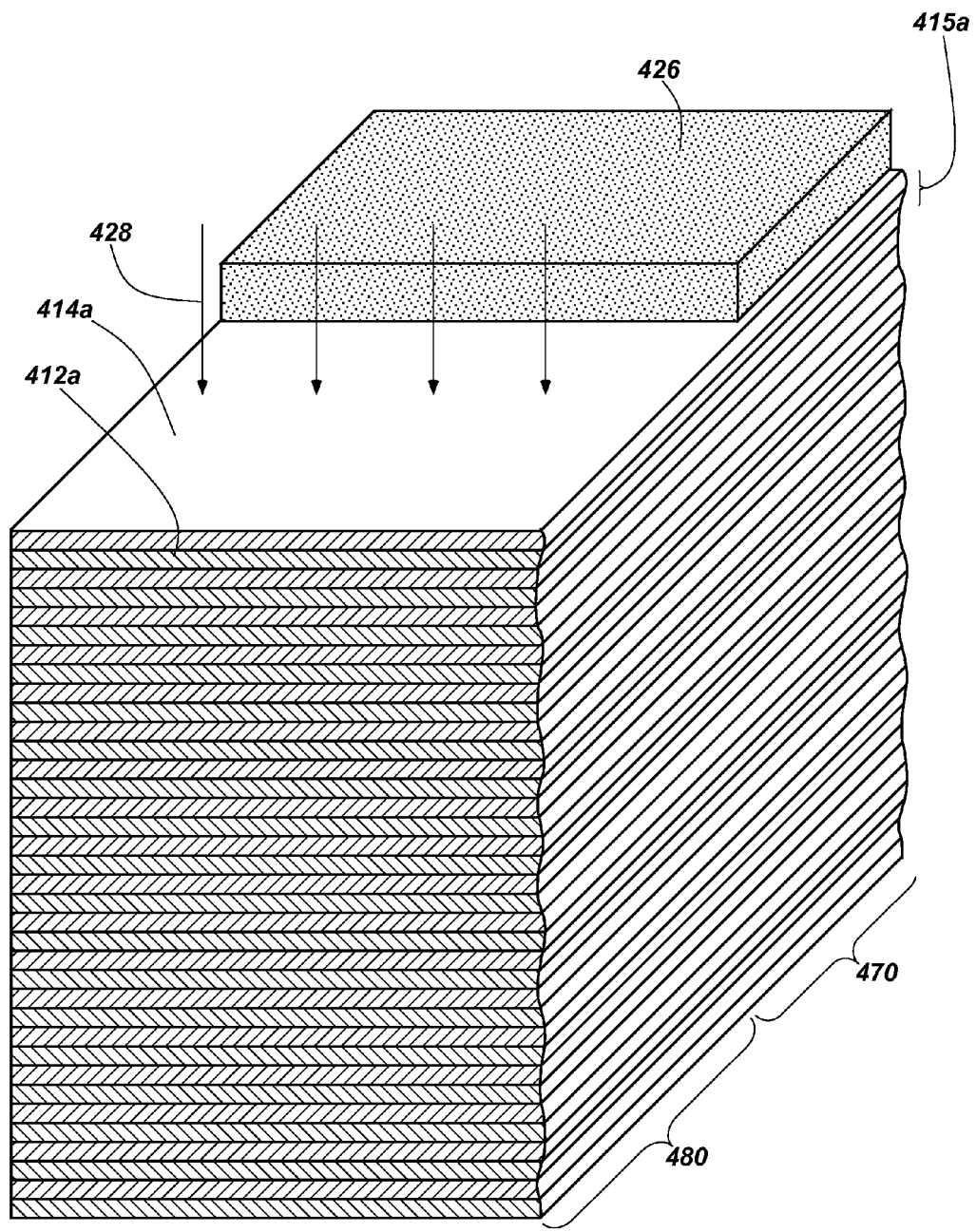
FIGS. 21 through 24 illustrate another embodiment of a process for forming a stair-step structure according to the present disclosure.

Another embodiment of a method for forming a stair-step structure, such as the stair-step structure 300 shown in FIG. 20, is illustrated in FIGS. 21 through 24. As shown in FIG. 21, alternating conductive materials 412 and insulating materials 414 may be formed over a substrate (not shown) to form a plurality of sets 415, each set 415 including one or more conductive material(s) 412 and one or more insulating material(s) 414. By way of example and not limitation, eighteen sets 415 are shown for clarity, although the disclosure is not so limited. A first mask 426 (also referred to as a "chop mask 426") may be formed over the insulating material 414a and patterned to expose the insulating material 414a in a second region 480 laterally adjacent a first region 470. The first mask 426 may also be formed to cover an array region (not shown). Material from the set 415a including the insulating material 414a and the conductive material 412a may be removed in the second region 480 by a cycle of an anisotropic etch 428.

Figure 22:
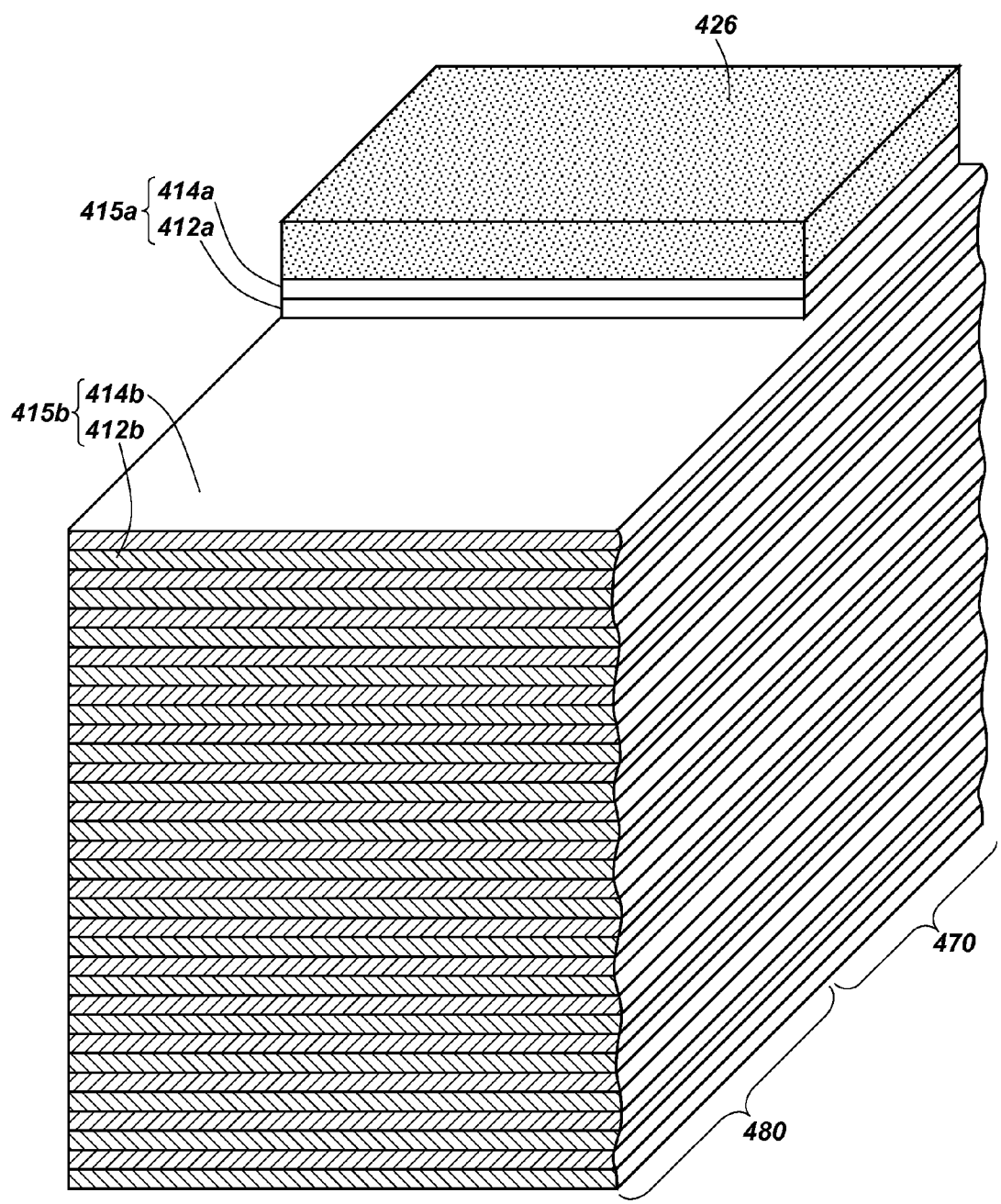
Figure 23:
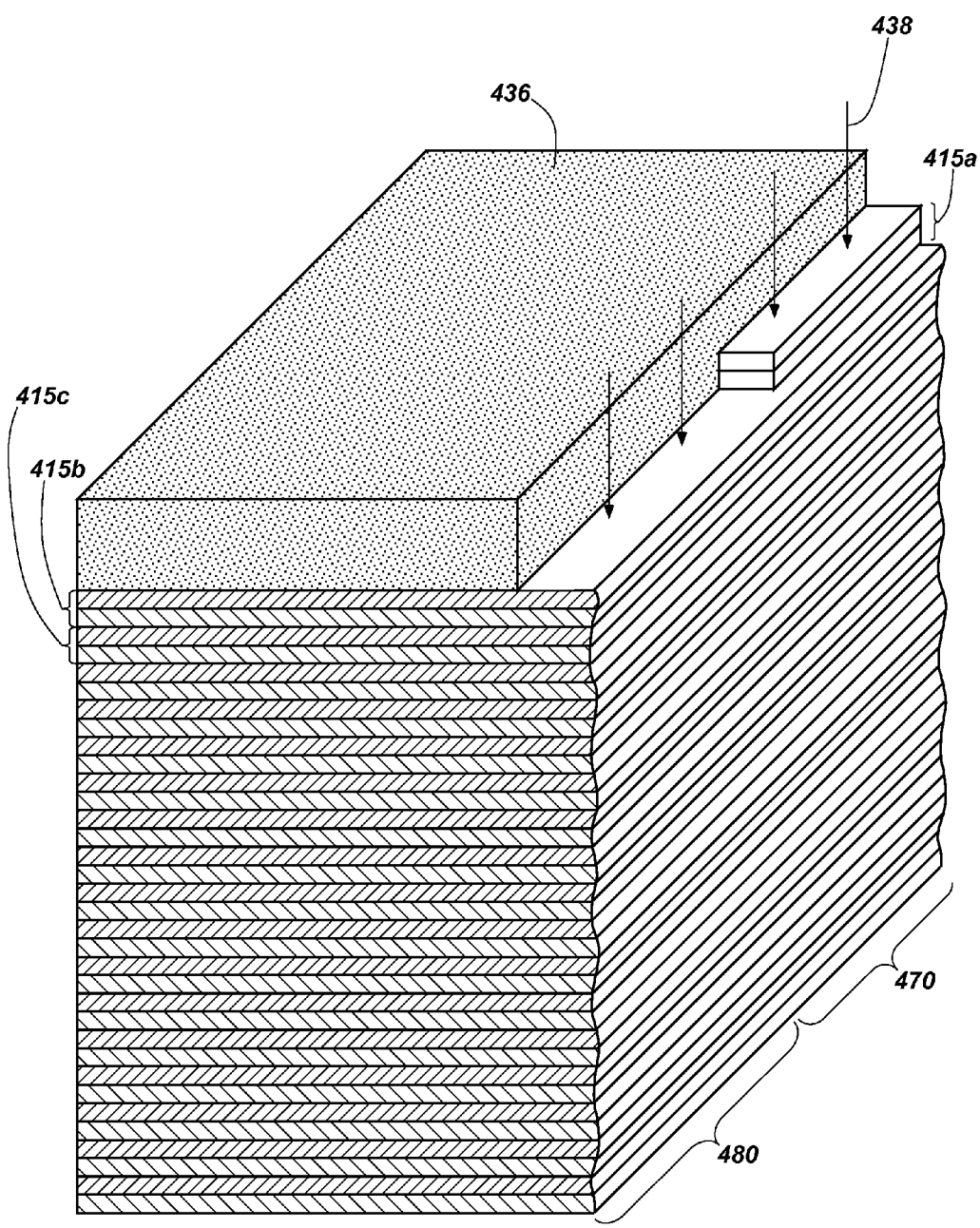
Figure 24:
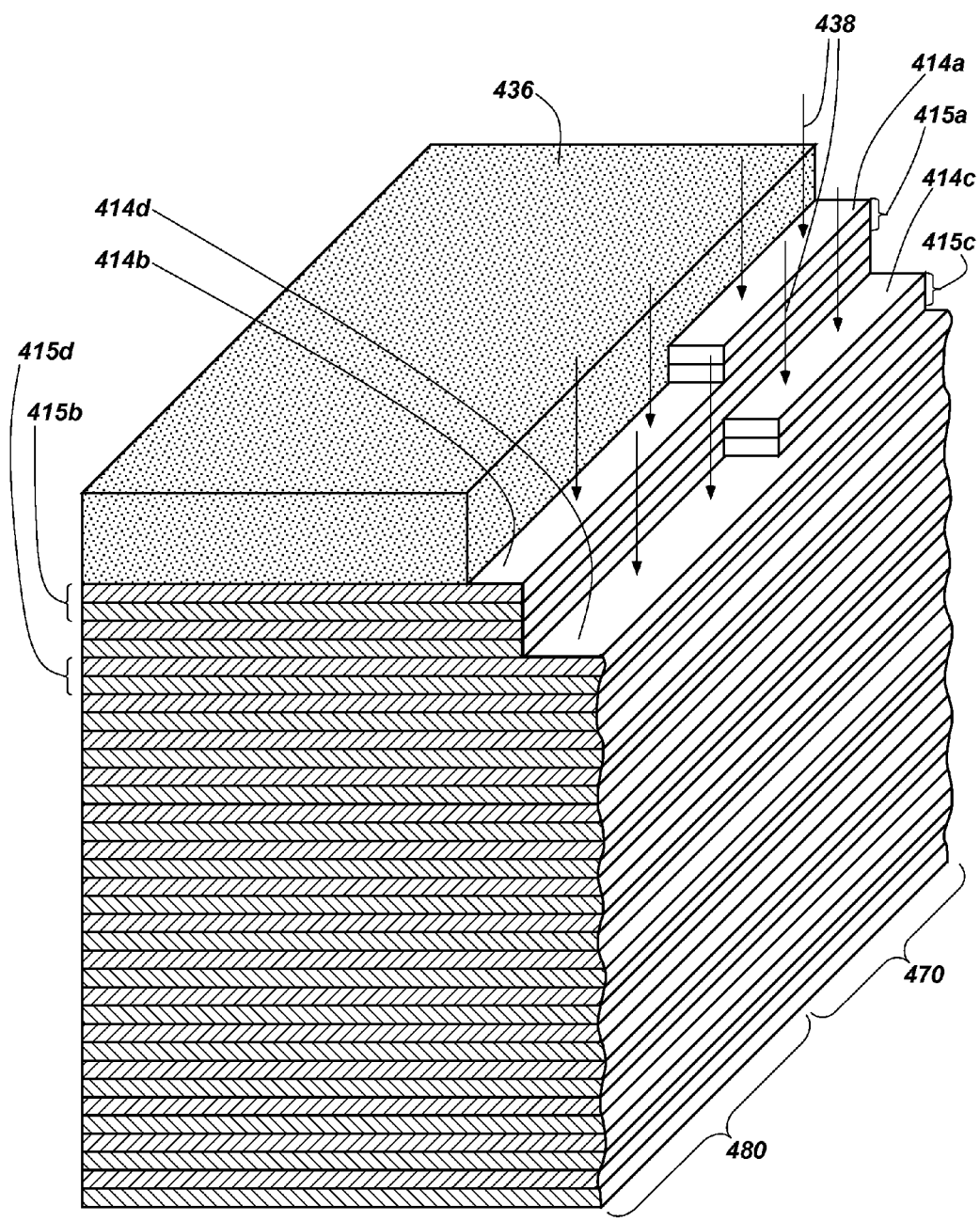

As shown in FIG. 22, the set 415a may remain in the first region 470 and be removed in the second region 480, exposing the insulating material 414b in the second region 480. The first mask 426 may be removed from the first region 470 to expose the insulating material 414a in the first region 470. Referring now to FIG. 23, a second mask 436 (also referred to as a "stair-step mask 436") may be formed over both the first region 470 and the second region 480 and patterned to expose approximately one stair-width of the insulating materials 414a and 414b. Material from the two sets 415a and 415b may be removed by an anisotropic etch 438 in the first region 470 and material from the two sets 415b and 415c may be removed by the anisotropic etch 438 in the second region 480. In other words, the anisotropic etch 438 may include two cycles of etching through insulating material 414 and conductive material 412. A portion of the second mask 436 may then be removed to expose a portion of the two sets 415a and 415b having a width of approximately one stair-width, as illustrated in FIG. 24.

In the first region 470, portions of the insulating material 414a and portions of the insulating material 414c may be exposed. In the second region 480 laterally adjacent the first region 470, portions of the second insulating material 414b and the fourth insulating material 414d may be exposed. Another anisotropic etch 438 may be performed to remove exposed portions of the sets 415a, 415b, 415c, and 415d, again removing two sets 415 in each exposed portion.

The acts of removing a portion of the second mask 436 and anisotropically etching 438 through exposed portions of two sets 415 may be repeated a plurality of times until a portion of each set 415 is exposed. The second mask 436 may then be removed. The embodiment illustrated and described with reference to FIGS. 21 through 24 may result in a stair-step structure 300 substantially identical in configuration to the stair-step structure 300 shown in FIG. 20.

Figure 25:
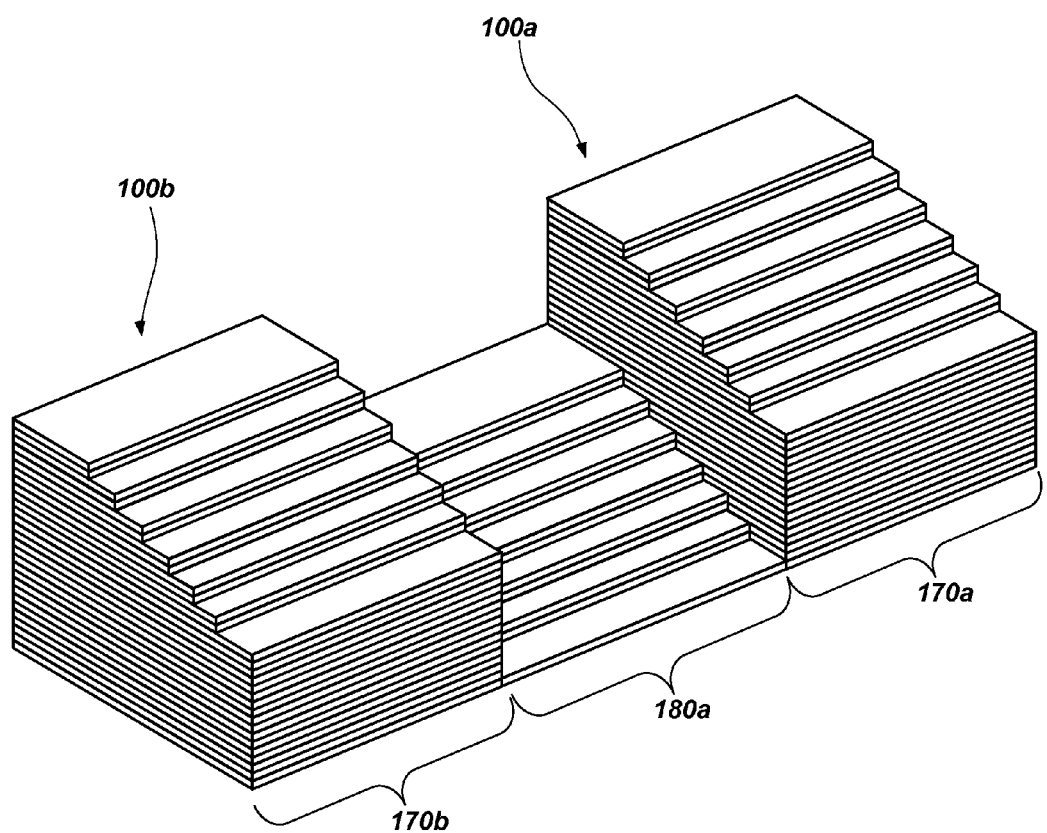
FIG. 25 illustrates an embodiment of a stair-step structure formed laterally adjacent another stair-step structure according to the present disclosure.

In some embodiments, multiple stair-step structures 100, 200, or 300 may be formed simultaneously following the methods described herein, as will be appreciated by one skilled in the art. By way of example and as illustrated in FIG. 25, a first stair-step structure 100a may be formed as described in more detail hereinabove to include a first region 170a and a second region 180a laterally adjacent the first region 170a. At the same time and by following the same methods, a second stair-step structure 100b may be formed laterally adjacent the first stair-step structure 100a. For example, a first region 170b of the second stair-step structure 100b may be formed laterally adjacent the second region 180a of the first stair-step structure 100a. The first stair-step structure 100a may be electrically insulated from the second stair-step structure 100b by way of an insulating material (not shown), which could be a void, disposed between the first and second stair-step structures 100a and 100b.

In some embodiments, a vertical memory device may include a stair-step structure, such as the stair-step structures 100, 200, or 300. Each conductive material 112, 212, 312, or 412 of the stair-step structure may function as a conductive connection (e.g., a word line connection). Each conductive material may provide electrical access to transistors (not shown) in a particular plane in a vertical memory array. Thus, any of the stair-step structures 100, 200, or 300 disclosed herein may be used in a vertical memory device, or other vertical device.

Several embodiments of stair-step structures and methods for forming stair-step structures have been shown and described. These embodiments may have advantages as compared to conventional structures and methods. For example, a margin of error in forming the plurality of stair-steps may be kept to a more reasonable and attainable level by utilizing the methods of the present disclosure as compared to conventional methods. The improvement in the margin of error may be achieved without the expense of utilizing large numbers of reticles that may be required for forming a plurality of masks. In addition, a stair-step structure of the present disclosure may cover less area than some conventional stair-step structures. The smaller area covered by the stair-step structure may allow a device including the stair-step structure to be produced more efficiently and cost-effectively. Furthermore, a space between adjacent stair-step structures may be reduced in size and therefore easier and/or cheaper to fill and planarize with material in subsequent manufacturing processes.

CONCLUSION

In one embodiment, a method of forming a semiconductor structure is described, including forming a plurality of sets of conductive material and insulating material, forming a first mask over a topmost set of the plurality of sets, removing a portion of the first mask to expose a portion of a major surface of the topmost set, removing the exposed portion of the topmost set, removing another portion of the first mask to expose another portion of the topmost set, and repeating the removing a portion of the first mask and removing the exposed portion of the topmost set until a first number of contact regions are formed. The method also includes forming a second mask over a first region of the plurality of sets and removing material from of the plurality of sets in a second, exposed region of the plurality of sets laterally adjacent the first region to form a second number of contact regions.

In a further embodiment, a method of forming a stair-step structure is described, including forming first contact regions on portions of sets of conductive materials and insulating materials, forming a mask over a region of the sets, and removing a portion of the sets not covered by the mask to form second contact regions. Each of the second contact regions may be more proximal to an underlying substrate than each of the first contact regions.

In an additional embodiment, a method of forming a vertical memory device is described, including forming a plurality of alternating word line connections and insulating materials and forming contact regions on portions of the word line connections. The method also includes forming a mask over a region of the alternating word line connections and insulating materials, removing a portion of the word line connections and insulating materials not covered by the mask, and forming contacts in connection with each contact region.

In another embodiment, an apparatus is described that includes a plurality of sets of conductive material and insulating material. A first region of the plurality of sets includes contact regions of a first portion of the plurality of sets and a second region of the plurality of sets includes contact regions of a second portion. The first region and the second region of the plurality of sets are laterally adjacent one another. The contact regions of the first region are offset from the contact regions of the second region.

In an additional embodiment, an apparatus is described, including a vertical memory array region including a plurality of conductive materials and a stair-step region also including the plurality of conductive materials. The stair-step region includes a first region and a second region laterally adjacent the first region. The first region includes contact regions of a first portion of the plurality of conductive materials and the second region includes contact regions of a second portion of the plurality of conductive materials different than the first portion. Each contact region of the first region is offset from each contact region of the second region.

In yet another embodiment, a method of forming a semiconductor structure is described including forming a plurality of sets of conductive material and insulating material, removing a first portion of a topmost set of the plurality, forming a mask over a first region of a second portion of the topmost set and leaving a second region of the second portion exposed, and removing the exposed second portion of the topmost set.

While the invention is susceptible to various modifications and alternative forms, specific embodiments have been shown by way of example in the drawings and have been described in detail herein. However, the invention is not intended to be limited to the particular forms disclosed. Rather, the invention is to cover all modifications, combinations, equivalents, and alternatives falling within the scope of the invention as defined by the following appended claims and their legal equivalents. For example, while embodiments of the present disclosure have been described as relating to vertical memory devices, other devices may include methods and structures similar to those described without exceeding the scope of the present disclosure. For example, a stair-step structure formed by the methods disclosed herein may be used to form contact regions for vertically stacked wiring busses, capacitors, or any other set of laminated conductors. In other words, any stair-step structure may be formed by the methods disclosed herein and be configured identically or similarly to the structures disclosed herein.

What is claimed is:

1. A method of forming a semiconductor structure, comprising:
    forming a stack of conductive materials over a substrate wherein adjacent conductive materials of the stack are separated from each other by a respective insulating material;
    forming first contact regions over portions of the conductive materials to form a stair step structure extending from a top first contact region to a bottom first contact region; and
    removing portions of half of the conductive materials of the stack to form second contact regions, each of the second contact regions being offset from a corresponding first contact region and adjacent to the corresponding first contact region in a direction perpendicular to a direction in which the stair step structure extends, a topmost second contact region being farther from the substrate than all but a topmost first contact region.

2. The method of claim 1, wherein forming first contact regions over portions of the conductive materials to form a stair step structure comprises:
    forming a mask over a topmost insulating material of the stack;
    removing a portion of the mask to expose a portion of the topmost insulating material;
    removing at least the exposed portion of the topmost insulating material and a portion of the conductive material under the exposed portion of the topmost insulating material;
    removing another portion of the mask to expose another portion of the topmost insulating material, the another portion of the topmost insulating material adjacent to the removed portion of the topmost insulating material of the stack; and
    repeating the removing a portion of the mask and removing at least the exposed portion of the topmost insulating material and a portion of the conductive material under the exposed portion of the topmost insulating material until the first contact regions and stair step structure are formed, each of the first contact regions forming the stair step structure being offset from other first contact regions forming the stair step structure.

3. The method of claim 1, wherein removing portions of half of the conductive materials of the stack to form second contact regions comprises:
    forming a mask over a first portion of the stair step structure; and
    removing portions of the half of the conductive materials in a second, exposed portion of the stair step structure.

4. The method of claim 1, further comprising:
    forming third contact regions, each of the third contact regions being offset from a corresponding first contact region; and
    forming fourth contact regions, each of the fourth contact regions being offset from a corresponding second contact region.

5. The method of claim 4, further comprising:
    forming at least one mask covering a portion of the first contact regions and a portion of at least one of the second contact regions, third contact regions, and fourth contact regions; and
    removing exposed portions of the conductive materials of the stack.

6. The method of claim 1, further comprising contacting the first contact regions and the second contact regions with respective conductive contacts.

7. The method of claim 1, wherein removing portions of half of the conductive materials of the stack comprises removing portions of half of the insulating materials of the stack.

8. An apparatus, comprising:
    a first stair step structure comprising first contact regions defined by a first portion of stacked conductive materials, the first stair step structure extending in a first direction from a top first contact region to a bottom first contact region; and
    a second stair step structure adjacent to the first stair step structure in a second direction perpendicular to the first direction, the second stair step structure comprising second contact regions defined by a second portion of the stacked conductive materials,
    wherein a top second contact region of the second stair step structure is lower than the top first contact region and higher than all other contact regions of the first contact regions and second contact regions.

9. The apparatus of claim 8, wherein the first stair step structure and the second stair step structure comprise steps, and each of the steps of the first stair step structure and of the second stair step structure comprises a contact region.

10. The apparatus of claim 8, further comprising an insulating material between adjacent conductive materials of the stacked conductive materials.

11. The apparatus of claim 8, wherein each of the first contact regions is offset from a corresponding second contact region.

12. The apparatus of claim 8, further comprising:
a third stair step structure adjacent to the second stair step structure in the second direction, the third stair step structure comprising third contact regions defined by a third portion of the stacked conductive materials; and
a fourth stair step structure adjacent to the third stair step structure in the second direction, the fourth stair step structure comprising fourth contact regions defined by a fourth portion of the stacked conductive materials.

13. The apparatus of claim 12, wherein each of the first contact regions is offset from a corresponding third contact region and each of the second contact regions is offset from a corresponding fourth contact region.

14. The apparatus of claim 8, further comprising conductive contacts respectively contacting the first contact regions and the second contact regions.

15. An apparatus, comprising:
first contact regions comprising respective conductive materials, the first contact regions defining a first stair step structure, wherein each of the first contact regions defines a step of the first stair step structure, the first stair step structure having steps ascending in a first direction; and
second contact regions adjacent to the first contact regions in a second direction perpendicular to the first direction, the second contact regions comprising respective conductive materials, the second contact regions defining a second stair step structure, wherein each of the second contact regions comprises a step of the second stair step structure and wherein a topmost step of the second stair step structure is higher than all but a topmost step of the first stair step structure in a third direction perpendicular to a top surface of a step of the second stair step structure.

16. The apparatus of claim 15, wherein each step of the first stair step structure and the second stair step structure is separated from a next ascending step by an insulating material.

17. The apparatus of claim 15, wherein each step of the first stair step structure is adjacent to and offset from a corresponding step of the second stair step structure.

* * * * *